(12) United States Patent
Zhang et al.

(10) Patent No.: US 12,464,924 B2
(45) Date of Patent: Nov. 4, 2025

(54) DISPLAY PANEL AND COLOR FILTER SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hongwei Zhang, Beijing (CN); Zhenye Wei, Beijing (CN); Xiongyi Luo, Beijing (CN); Cheng Zeng, Beijing (CN); Qiyun Wang, Beijing (CN); Zhen Sun, Beijing (CN); Lulin Ma, Beijing (CN)

(73) Assignees: Chengdu BOE Optoelectronics Technology Co., Ltd., Sichuan (CN); Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 17/926,395

(22) PCT Filed: Dec. 30, 2021

(86) PCT No.: PCT/CN2021/143262
§ 371 (c)(1),
(2) Date: Nov. 18, 2022

(87) PCT Pub. No.: WO2023/123251
PCT Pub. Date: Jul. 6, 2023

(65) Prior Publication Data
US 2024/0224691 A1    Jul. 4, 2024

(51) Int. Cl.
*H10K 59/38*    (2023.01)
*H10K 59/126*    (2023.01)
(Continued)

(52) U.S. Cl.
CPC ........... *H10K 59/38* (2023.02); *H10K 59/126* (2023.02); *H10K 59/35* (2023.02); *H10K 59/40* (2023.02);
(Continued)

(58) Field of Classification Search
CPC ...... H10K 59/38; H10K 59/126; H10K 59/35; H10K 59/40; H10K 59/877;
(Continued)

(56) References Cited

U.S. PATENT DOCUMENTS 11,744,105 B2 * 8/2023 Cai ................... H10K 50/858
257/89
2012/0099054 A1 4/2012 Takeuchi et al.
(Continued)

FOREIGN PATENT DOCUMENTS

CN    111261665 A    6/2020
JP    2015099633 A    5/2015
(Continued)

OTHER PUBLICATIONS

Japanese Office Action (with English translation) for corresponding Application No. 2023-579682, dated Jul. 25, 2025, 10 pages.
(Continued)

*Primary Examiner* — David Vu
(74) *Attorney, Agent, or Firm* — Dority & Manning, P.A.

(57) ABSTRACT

A display panel includes a first base substrate, a light-emitting device layer located on a side of the first base substrate, a color filter layer located on a side of the light-emitting device layer away from the first base substrate, a color conversion layer located between the light-emitting device layer and the color filler layer, a touch function layer located on a side of the color conversion layer away from the first base substrate and a light adjustment layer located on a side of the touch function layer away from
(Continued)

the first base substrate. The light adjustment layer includes first particles and second particles. The first particles each include dye molecules. The second particles each have a hollow structure.

20 Claims, 15 Drawing Sheets

(51) Int. Cl.
*H10K 59/35* (2023.01)
*H10K 59/40* (2023.01)
*H10K 59/80* (2023.01)
*H10K 102/00* (2023.01)

(52) U.S. Cl.
CPC ..... *H10K 59/877* (2023.02); *H10K 2102/331* (2023.02); *H10K 2102/351* (2023.02)

(58) Field of Classification Search
CPC ....... H10K 2102/331; H10K 2102/351; H10K 59/12; H10K 59/8792; H10K 59/879; H10K 59/87; H10K 77/10; G06F 2203/04112; G06F 3/0446; C09K 11/70; C09K 11/883
See application file for complete search history.

(56) References Cited

U.S. PATENT DOCUMENTS

| | | |
|---|---|---|
| 2016/0042702 A1 | 2/2016 | Hirakata et al. |
| 2017/0090247 A1 | 3/2017 | Lee et al. |
| 2018/0088404 A1 | 3/2018 | Chae et al. |
| 2019/0096960 A1 | 3/2019 | Lee |
| 2019/0179065 A1 | 6/2019 | Kim et al. |
| 2020/0033670 A1 | 1/2020 | Lee et al. |
| 2020/0081292 A1 | 3/2020 | Park et al. |
| 2020/0091248 A1 | 3/2020 | Lin et al. |
| 2020/0119101 A1 | 4/2020 | Lee |
| 2020/0194502 A1 | 6/2020 | Joo et al. |
| 2020/0227485 A1 | 7/2020 | Park et al. |
| 2020/0258944 A1 | 8/2020 | Joo et al. |
| 2020/0373360 A1 | 11/2020 | Hack et al. |
| 2022/0278174 A1 | 9/2022 | Yu et al. |

FOREIGN PATENT DOCUMENTS

| | | |
|---|---|---|
| JP | 2015128027 A | 7/2015 |
| JP | 2018049254 A | 3/2018 |
| JP | 2019040179 A | 3/2019 |
| JP | 2021117249 A | 8/2021 |
| KR | 20040093143 A | 11/2004 |
| KR | 20180014334 A | 2/2018 |
| KR | 20200029093 A | 3/2020 |
| KR | 20200084967 A | 7/2020 |
| KR | 20210030538 A | 3/2021 |
| KR | 20210081873 A | 7/2021 |
| KR | 20210152067 A | 12/2021 |
| WO | WO2014181515 A1 | 11/2014 |

OTHER PUBLICATIONS

Korean Office Action for (with English translation) for corresponding Application No. 10-2023-7043592, , dated Sep. 17, 2025, 24 pages.

* cited by examiner

DISPLAY PANEL AND COLOR FILTER SUBSTRATE

CROSS-REFERENCE TO RELATED APPLICATION

This application is a national phase entry under 35 USC 371 of International Patent Application No. PCT/CN2021/143262 filed on Dec. 30, 2021, which is incorporated herein by reference in its entirety.

TECHNICAL FIELD

The present disclosure relates to the field of display technologies, and in particular, to a display panel and a color filter substrate.

BACKGROUND

With the continuous development of electronic products, panels having display functions, i.e., display panels, are widely used in people's life and work, which provides convenience for people.

SUMMARY

In an aspect, a display panel is provided. The display panel has a plurality of repeating pixel units that are repeated each other. Each pixel unit includes a first sub-pixel, a second sub-pixel and a third sub-pixel that are configured to display different colors. The display panel includes: a first base substrate, a light-emitting device layer, a color filter layer, a color conversion layer, a touch function layer and a light adjustment layer.

The light-emitting device layer is located on a side of the first base substrate. The light-emitting device layer includes first light-emitting devices, second light-emitting devices and third light-emitting devices. The first light-emitting devices are located in first sub-pixels respectively. The second light-emitting devices are located in second sub-pixels respectively. The third light-emitting devices are located in third sub-pixels respectively.

The color filter layer is located on a side of the light-emitting device layer away from the first base substrate, and includes at least a first light-shielding pattern, first color filters and second color filters. The first light-shielding pattern defines a plurality of light-transmitting regions. The light-transmitting regions include first light-transmitting regions respectively corresponding to the first sub-pixels, second light-transmitting regions respectively corresponding to the second sub-pixels and third light-transmitting regions respectively corresponding to the third sub-pixels. The first color filters are located in the first light-transmitting regions respectively; and second color filters are located in the second light-transmitting regions respectively.

The color conversion layer is located between the light-emitting device layer and the color filter layer. The color conversion layer includes first color conversion patterns, second color conversion patterns and light-transmitting patterns. The first color conversion patterns are located in the first sub-pixels respectively. The second color conversion patterns are located in the second sub-pixels respectively. The light-transmitting patterns are located in the third sub-pixels respectively.

The touch function layer is located on a side of the color conversion layer away from the first base substrate.

The light adjustment layer is located on a side of the touch function layer away from the first base substrate. An orthographic projection of the light adjustment layer on the first base substrate at least overlaps with the third light-transmitting regions. The light adjustment layer includes first particles and second particles. The first particles include dye molecules. The second particles have a hollow structure.

In some embodiments, the orthographic projection of the light adjustment layer on the first base substrate only overlaps with the third light-transmitting regions.

In some embodiments, the display panel further includes transparent resin filling patterns disposed in a same layer as the light adjustment layer. The first light-transmitting regions and the second light-transmitting regions each overlap with a respective transparent resin filling pattern.

In some embodiments, the light adjustment layer includes a first light adjustment layer and a second light adjustment layer that are stacked. The first light adjustment layer includes the first particles, and the second light adjustment layer includes the second particles.

In some embodiments, the first light adjustment layer is located on the side of the touch function layer away from the first base substrate, and the second light adjustment layer is located between the first light adjustment layer and the touch function layer.

Alternatively, the first light adjustment layer is located on the side of the touch function layer away from the first base substrate, and the second light adjustment layer is located on a side of the first light adjustment layer away from the touch function layer.

In some embodiments, an orthographic projection of the first light adjustment layer on the first base substrate only overlaps with the third light-transmitting regions.

Alternatively, an orthographic projection of the second light adjustment layer on the first base substrate overlaps with each of the first light-transmitting regions, the second light-transmitting regions and the third light-transmitting regions.

In some embodiments, the light adjustment layer further includes a second light-shielding pattern. The second light-shielding pattern is located in a light-blocking region that is non-overlapping with the first light-transmitting regions, the second light-transmitting regions and the third light-transmitting regions.

In some embodiments, in a direction perpendicular to the display panel, a thickness of the second light-shielding pattern is less than or equal to a thickness of the first light adjustment layer.

Alternatively, the second light adjustment layer includes a plurality of first patterns, a plurality of second patterns and a plurality of third patterns that are separated from each other. The first patterns are located in the first light-transmitting regions respectively, the second patterns are located in the second light-transmitting regions respectively, and the third patterns are located in the third light-transmitting regions respectively. In a direction perpendicular to the display panel, a thickness of the second light-shielding pattern is approximately equal to a thickness of a first pattern of the plurality of first patterns and/or a thickness of a second pattern of the plurality of second patterns, and is approximately equal to a sum of a thickness of a third pattern of the plurality of third patterns and a thickness of the first light adjustment layer.

In some embodiments, the light adjustment layer and the color filter layer are disposed in a same layer.

In some embodiments, a color of the dye molecules is same as a color of the third sub-pixel.

Alternatively, the second particles are in a shape of a sphere, and include a core portion filled with air and a shell portion surrounding the core portion.

In some embodiments, the first color conversion patterns and the second color conversion patterns both include a quantum dot material and scattering particles.

In some embodiments, the display panel further includes a light extraction layer and an encapsulation layer. The light extraction layer is located on a side of the light-emitting device layer away from the first base substrate. The encapsulation layer is located on a side of the light extraction layer away from the first base substrate.

Alternatively, the display panel further includes a second base substrate. The second base substrate is located on a side of the light adjustment layer away from the first base substrate.

In another aspect, a color filter substrate is provided. The color filter substrate includes a base substrate, a color filter layer, a color conversion layer, a touch function layer and a light adjustment layer.

The color filter layer is located on the base substrate, and at least includes a first light-shielding pattern, first color filters and second color filters. The first light-shielding pattern defines a plurality of light-transmitting regions. The light-transmitting region includes first light-transmitting regions for transmitting light of a first color, second light-transmitting regions for transmitting light of a second color and third light-transmitting regions for transmitting light of third color.

The color conversion layer is located on a side of the color filter layer away from the base substrate, and includes first color conversion patterns, second color conversion patterns and light-transmitting patterns.

The touch function layer is located between the color conversion layer and the base substrate.

The light adjustment layer is located between the touch function layer and the base substrate. An orthographic projection of the light adjustment layer on the base substrate at least overlaps with the third light-transmitting regions. The light adjustment layer includes first particles and second particles. The first particles include dye molecules. The second particles each have a hollow structure.

In some embodiments, the orthographic projection of the light adjustment layer on the base substrate only overlaps with the third light-transmitting regions.

In some embodiments, the color filter substrate further includes transparent resin filling patterns disposed in a same layer as the light adjustment layer. The first light-transmitting regions and the second light-transmitting regions each overlap with a respective transparent resin filling pattern.

In some embodiments, the light adjustment layer includes a first light adjustment layer and a second light adjustment layer that are stacked. The first light adjustment layer includes the first particles. The second light adjustment layer includes the second particles.

In some embodiments, the second light adjustment layer is located between the first light adjustment layer and the touch function layer.

Alternatively, the first light adjustment layer is located between the second light adjustment layer and the touch function layer.

In some embodiments, an orthographic projection of the first light adjustment layer on the base substrate only overlaps with the third light-transmitting region.

Alternatively, an orthographic projection of the second light adjustment layer on the base substrate overlaps with each of the first light-transmitting regions, the second light-transmitting regions and the third light-transmitting regions.

In some embodiments, the light adjustment layer further includes a second light-shielding pattern. The second light-shielding pattern is located in a light-blocking region that is non-overlapping with the first light-transmitting regions, the second light-transmitting regions and the third light-transmitting regions.

In some embodiments, the second light adjustment layer includes a plurality of first patterns, a plurality of second patterns and a plurality of third patterns that are separated from each other. The first patterns are located in the first light-transmitting regions, the second patterns are located in the second light-transmitting regions, and the third patterns are located in the third light-transmitting regions. In a direction perpendicular to the color filter substrate, a thickness of the second light-shielding pattern is approximately equal to a thickness of a first pattern of the plurality of first patterns and/or a thickness of a second pattern of the plurality of second patterns, and is approximately equal to a sum of a thickness of a third pattern of the plurality of third patterns and a thickness of the first light adjustment layer.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person having ordinary skill in the art can obtain other drawings according to these accompanying drawings. In addition, the accompanying drawings in the following description may be regarded as schematic diagrams, but are not limitations on an actual size of a product, an actual process of a method and an actual timing of a signal involved in the embodiments of the present disclosure.

DETAILED DESCRIPTION

Figure 1:
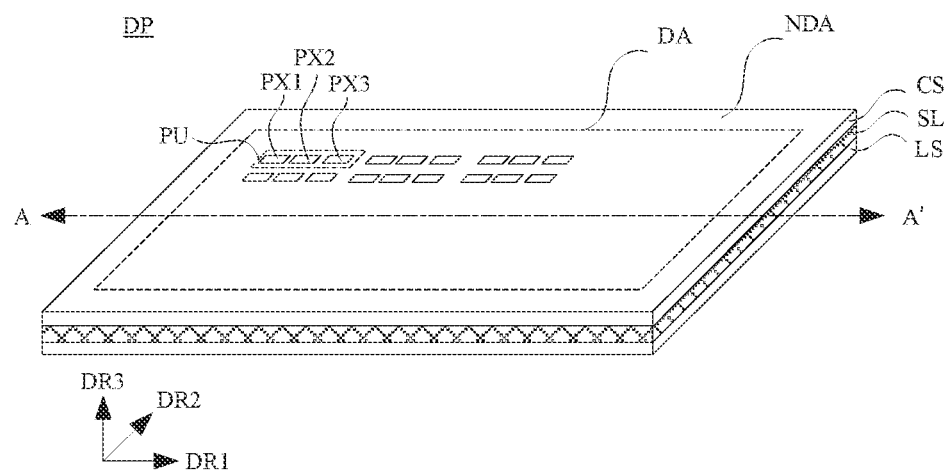
FIG. 1 is a perspective view of a display panel, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms does not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a plurality of/the plurality of" means two or more unless otherwise specified.

Some embodiments may be described using the terms "electrically connected" and "connected" and their derivatives. For example, the term "electrically connected" may be used in the description of some embodiments to indicate that two or more components are in direct physical or electrical contact with each other. The embodiments disclosed herein are not necessarily limited to the content herein.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, the terms such as "about", "substantially" or "approximately" include a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in a device, and are not intended to limit the scope of the exemplary embodiments.

Figure 2:
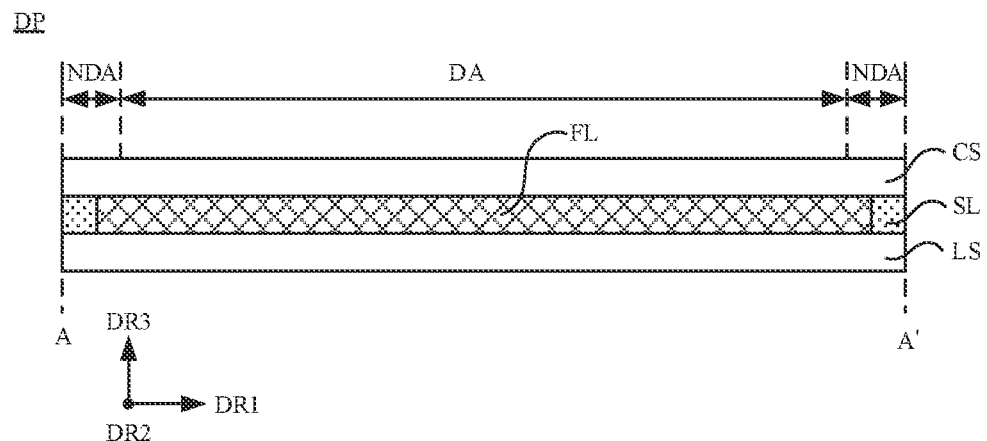
FIG. 2 is a section taken along the line A-A' in FIG. 1.

FIG. 1 is a perspective view of a display panel DP in accordance with some embodiments. FIG. 2 is a schematic section taken along the line A-A' in accordance with the display panel DP in embodiments shown in FIG. 1. As shown in FIGS. 1 and 2, the display panel DP includes a light-emitting substrate LS and a color conversion substrate CS. The display panel DP includes a display region DA for displaying an image and a non-display region NDA which does not display an image. The non-display region NDA is located outside the display region DA. In some examples, the non-display region NDA may encircle the display region DA, or may be located on an outside of the display region DA in at least one direction. The display panel DP further includes: a sealing layer SL for sealing a space between the light-emitting substrate LS and the color conversion substrate CS, and a filling layer FL filled between the light-emitting substrate LS and the color conversion substrate CS.

The display panel DP in a plan view may be in a shape of a rectangle, a circle, an ellipse, a rhombus, a trapezoid, a square or other shapes depending to display requirements.

The display panel DP may be applied to various electronic apparatuses, for example, small to medium sized electronic apparatuses such as tablet computers, smart phones, head-mounted displays, car navigation units, cameras, central information displays (CIDs) provided in vehicles, watch-type electronic devices or other wearable devices, personal digital assistants (PDAs), portable multimedia players (PMPs) and game consoles, and medium to large electronic apparatuses such as televisions, external billboards, monitors, home appliances including display screens, personal computers and laptop computers. The electronic apparatuses may merely represent examples of application of the display panel DP. However, those skilled in the art may recognize that, the display panel DP may also be applied to other apparatuses without departing from the spirit and scope of the present disclosure.

The color conversion substrate CS may be disposed opposite to the light-emitting substrate LS. The color conversion substrate CS may include a color conversion structure for converting a color of incident light. The color conversion structure (i.e., a color conversion pattern) may include at least one of a color filter and a wavelength conversion pattern.

The sealing layer SL may be located between the light-emitting substrate LS and the color conversion substrate CS and in the non-display region NDA. The sealing layer SL may be disposed along edges of the light-emitting substrate LS and the color conversion substrate CS in the non-display region NDA, that is, the sealing layer SL is disposed in a periphery of the display region DA and next to or not next to the display region DA. The sealing layer SL may be made of an organic material such as epoxy resin, which is not limited thereto.

The filling layer FL may be located in and fill the space that is located between the light-emitting substrate LS and the color conversion substrate CS and surrounded by the sealing layer SL. The filling layer FL may be made of a material capable of transmitting light. The filling layer FL may be made of an organic material such as a silicon-based organic material or an epoxy-based organic material, which is not limited thereto. In some embodiments, the filling layer FL may be omitted.

As shown in FIG. 1, the display panel DP has a plurality of pixel units PU. At least one pixel unit PU includes a first sub-pixel PX1, a second sub-pixel PX2 and a third sub-pixel PX3 that display different colors. Each sub-pixel is composed of a structure located in the light-emitting substrate LS and a structure located in the color conversion substrate CS. The plurality of pixel units PU may be repeated.

Figure 3:
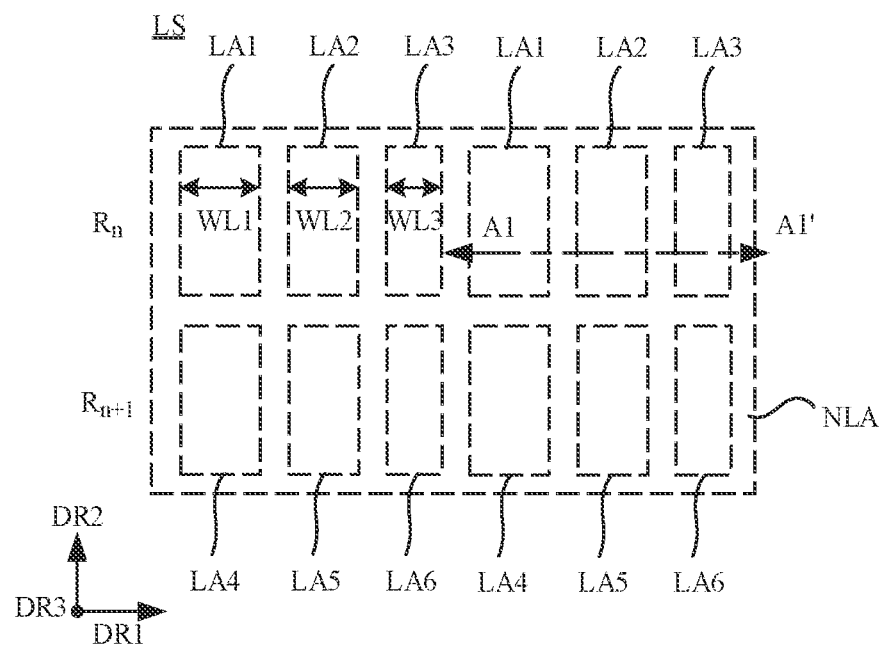
FIG. 3 is a plan view of a light-emitting substrate, in accordance with some embodiments.

FIG. 3 shows a plan view of a portion of the light-emitting substrate in the display region of the display panel illustrated in FIGS. 1 and 2. As shown in FIG. 3, light-emitting regions LA1, LA2, LA3, LA4, LA5 and LA6 and a non-light-emitting region NLA may be defined in the display region DA. Light emitted from the light-emitting regions LA1, LA2, LA3, LA4, LA5 and LA6 to an outside of the light-emitting substrate LS may be emitted light with a specific center wavelength. For example, the emitted light may be blue light and have a peak wavelength in a range of about 440 nm to about 480 nm, inclusive.

The light-emitting substrate LS may include the light-emitting regions LA1, LA2 and LA3 in an nth row $R_n$ and light-emitting regions LA4, LA5 and LA6 in an (n+1)th row $R_{n+1}$ adjacent thereto, which are disposed in the display region DA. In the light-emitting substrate LS, in the nth row $R_n$, the first light-emitting region LA1, the second light-emitting region LA2 and the third light-emitting region LA3 may be arranged sequentially and repeatedly in a first direction DR1; and in the (n+1)th row $R_{n+1}$, the fourth light-emitting region LA4, the fifth light-emitting region LA5 and the sixth light-emitting region LA6 may be arranged sequentially and repeatedly in the first direction DR1.

A single repeating light-emitting region unit (i.e., a unit including three light-emitting regions adjacent to each other in the first direction DR1) corresponds to a single repeating pixel unit. For example, in the nth row $R_n$, the first light-emitting region LA1 of the first sub-pixel PX1, the second light-emitting region LA2 of the second sub-pixel PX2, and the third light-emitting region LA3 of the third sub-pixel PX3 are sequentially arranged in the first direction DR1.

In the single repeating light-emitting region unit in the nth row $R_n$, the first light-emitting region LA1 has a first width WL1 in the first direction DR1, the second light-emitting region LA2 has a second width WL2 in the first direction DR1, and the third light-emitting region LA3 has a third width WL3 in the first direction DR1. The first width WL1, the second width WL2 and the third width WL3 may be same as or different from each other. Embodiments of the present disclosure are not limited thereto.

In exemplary embodiments, the first width WL1 of the first light-emitting region LA1 may be greater than the second width WL2 of the second light-emitting region LA2 and the third width WL3 of the third light-emitting region LA3. In some embodiments, the second width WL2 of the second light-emitting region LA2 may be greater than the third width WL3 of the third light-emitting region LA3. Therefore, an area of the first light-emitting region LA1 may be greater than an area of the second light-emitting region LA2 and an area of the third light-emitting region LA3, and the area of the second light-emitting region LA2 may be greater than the area of the third light-emitting region LA3.

In exemplary embodiments, the first width WL1 of the first light-emitting region LA1, the second width WL2 of the second light-emitting region LA2 and the third width WL3 of the third light-emitting region LA3 may be substantially same. Therefore, the area of the first light-emitting region LA1, the area of the second light-emitting region LA2 and the area of the third light-emitting region LA3 may be substantially same.

Similarly, in a single repeating light-emitting region unit in the adjacent (n+1)th row $R_{n+1}$, the fourth light-emitting region LA4, the fifth light-emitting regions LA5 and the sixth light-emitting region LA6 may have substantially same structures as the first light-emitting regions LA1, second light-emitting regions LA2 and the third light-emitting region LA3 in the nth row $R_n$, respectively.

Figure 4:
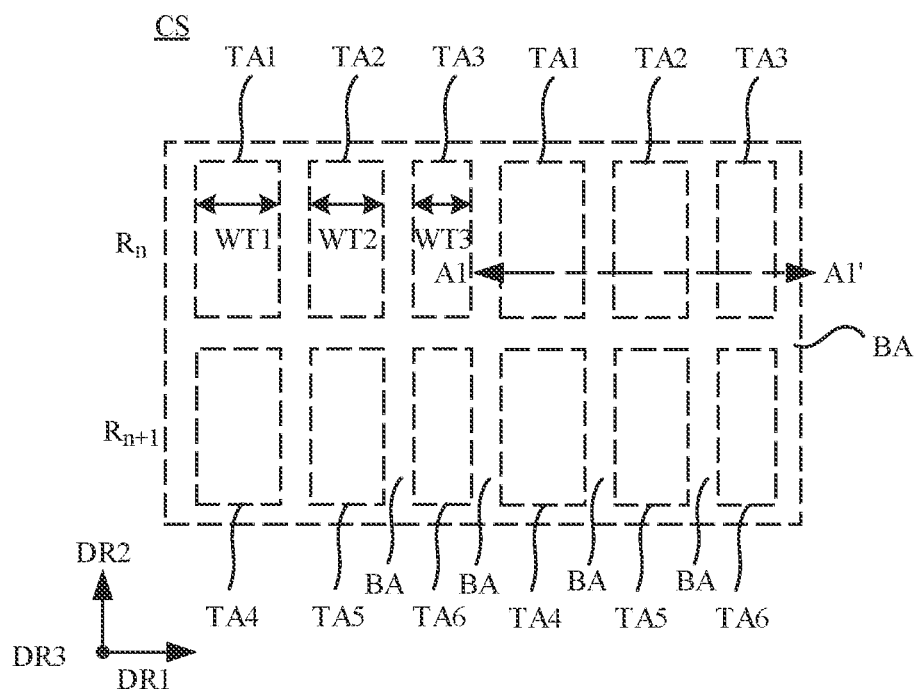
FIG. 4 is a plan view of an color conversion substrate, in accordance with some embodiments.

FIG. 4 shows a plan view of a portion of the color conversion substrate in the display region of the display panel illustrated in FIGS. 1 and 2. As shown in FIG. 4, light-transmitting regions TA1, TA2, TA3, TA4, TA5 and TA6 and a light-blocking region BA may be defined in the display region DA. In the light-transmitting regions TA1, TA2, TA3, TA4, TA5 and TA6, light emitted from the light-emitting substrate LS can pass through the color conversion substrate CS and be directed to an outside of the display panel DP. In the light-blocking region BA, light emitted from the display substrate 10 cannot exit outside of the display panel DP through transmission.

The color conversion substrate CS may include the light-transmitting regions TA1, TA2 and TA3 in the nth row $R_n$ and the light-transmitting regions TA4, TA5 and TA6 in the (n+1)th row $R_{n+1}$ adjacent thereto, which are disposed in the display region DA. In the color conversion substrate CS, in the nth row $R_n$, the first light-transmitting region TA1, the second light-transmitting region TA2 and the third light-transmitting region TA3 may be sequentially and repeatedly arranged in the first direction DR1; and in the (n+1)th row $R_{n+1}$, the fourth light-transmitting region TA4, the fifth light-transmitting region TA5 and the sixth light-transmitting region TA6 may be sequentially and repeatedly arranged in the first direction DR1.

The first light-transmitting region TA1 may correspond to the first light-emitting region LA1, and overlap with or face the first light-emitting region LA1 to form a light channel of the first sub-pixel PX1. Similarly, the second light-transmitting region TA2 may correspond to the second light-emitting region LA2, and overlap with or face the second light-emitting region LA2 to form a light channel of the second sub-pixel PX2. In addition, the third light-transmitting region TA3 may correspond to the third light-emitting region LA3, and overlap with or face the third light-emitting region LA3 to form a light channel of the third sub-pixel PX3. Similarly, the fourth light-transmitting region TA4, the fifth light-transmitting region TA5 and the sixth light-transmitting region TA6 may overlap with or face the fourth light-emitting region LA4, the fifth light-emitting region LA5 and the sixth light-emitting region LA6, respectively.

Emitted light provided from the light-emitting substrate LS may be directed to the outside of the display panel DP after passing through the first light-transmitting region TA1, the second light-transmitting region TA2 and the third light-transmitting region TA3. Light emitted from the first light-transmitting region TA1 to the outside of the display panel DP may be referred to as first outgoing light. Light emitted from the second light-transmitting region TA2 to the outside of the display panel DP may be referred to as second outgoing light. Light emitted from the third light-transmitting region TA3 to the outside of the display panel DP may be referred to as third outgoing light. The first outgoing light may be light of a first color, the second outgoing light may be light of a second color different from the first color, and the third outgoing light may be light of a third color different from the first color and the second color. As described above, the light of the first color may be red light having a peak wavelength in a range of about 610 nm to about 650 nm, inclusive. The light of the second color may be green light having a peak wavelength in a range of about 510 nm to about 550 nm, inclusive. The light of the third color may be blue light having a peak wavelength in a range of about 440 nm to about 480 nm, inclusive.

In a single repeating light-transmitting region unit (i.e., a unit including three light-transmitting regions adjacent to each other in the first direction DR1), in the nth row $R_n$, the first light-transmitting region TA1 may have a first width WT1 in the first direction DR1, the second light-transmitting region TA2 may have a second width WT2 in the first direction DR1, and the third light-transmitting region TA3 may have a third width WT3 in the first direction DR1. The first width WT1 of the first light-transmitting region TA1, the second width WT2 of the second light-transmitting region TA2 and the third width WT3 of the third light-transmitting region TA3 may be same as or different from each other. Embodiments of the present disclosure are not limited thereto.

In exemplary embodiments, the first width WT1 of the first light-transmitting region TA1 may be greater than the second width WT2 of the second light-transmitting region TA2 and the third width WT3 of the third light-transmitting region TA3. In some embodiments, the second width WT2 of the second light-transmitting region TA2 may be greater than the third width WT3 of the third light-transmitting region TA3. Therefore, an area of the first light-transmitting region TA1 may be greater than an area of the second light-transmitting region TA2 and an area of the third light-transmitting region TA3, and the area of the second light-transmitting region TA2 may be greater than an area of the third light-transmitting region TA3. In other exemplary embodiments, the first width WT1 of the first light-transmitting region TA1, the second width WT2 of the second light-transmitting region TA2 and the third width WT3 of the third light-transmitting region TA3 may be substantially same. Therefore, the area of the first light-transmitting region TA1, the area of the second light-transmitting region TA2 and the area of the third light-transmitting region TA3 may be substantially same.

In the color conversion substrate CS, the light-blocking region BA may be located around the light-transmitting regions TA1, TA2, TA3, TA4, TA5 and TA6 in the display region DA.

Figure 5:
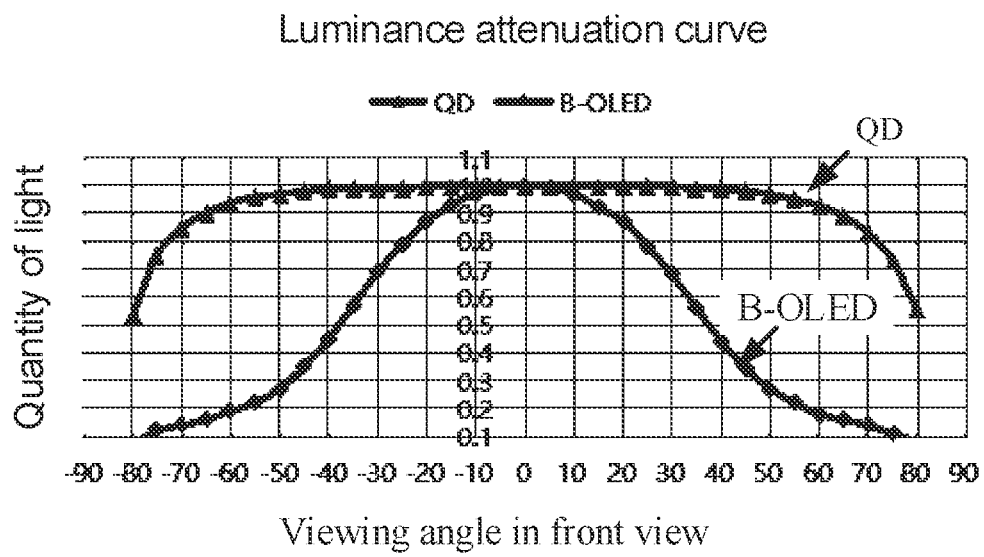
FIG. 5 is a comparison diagram of luminance decay of blue light due to micro-cavity effect and luminance decay of light emitted from a quantum dot film at different angles.

It is found by the inventors of the present disclosure through researches that, as shown in FIG. 5, luminance of blue light emitted by a blue organic light-emitting diode (OLED) decreases significantly as an angle changes due to the micro-cavity effect; and since a red quantum dot (QD) film and a green quantum dot (QD) film have characteristics of full angle luminescence and are absent from the micro-cavity effect, the luminance thereof change slightly as the angle changes. Therefore, as a viewing angle changes, the luminance of blue light decreases rapidly, while the luminance of red light and green light are almost unchanged, which leads to serious color cast of white light at a large viewing angle.

Figure 6:
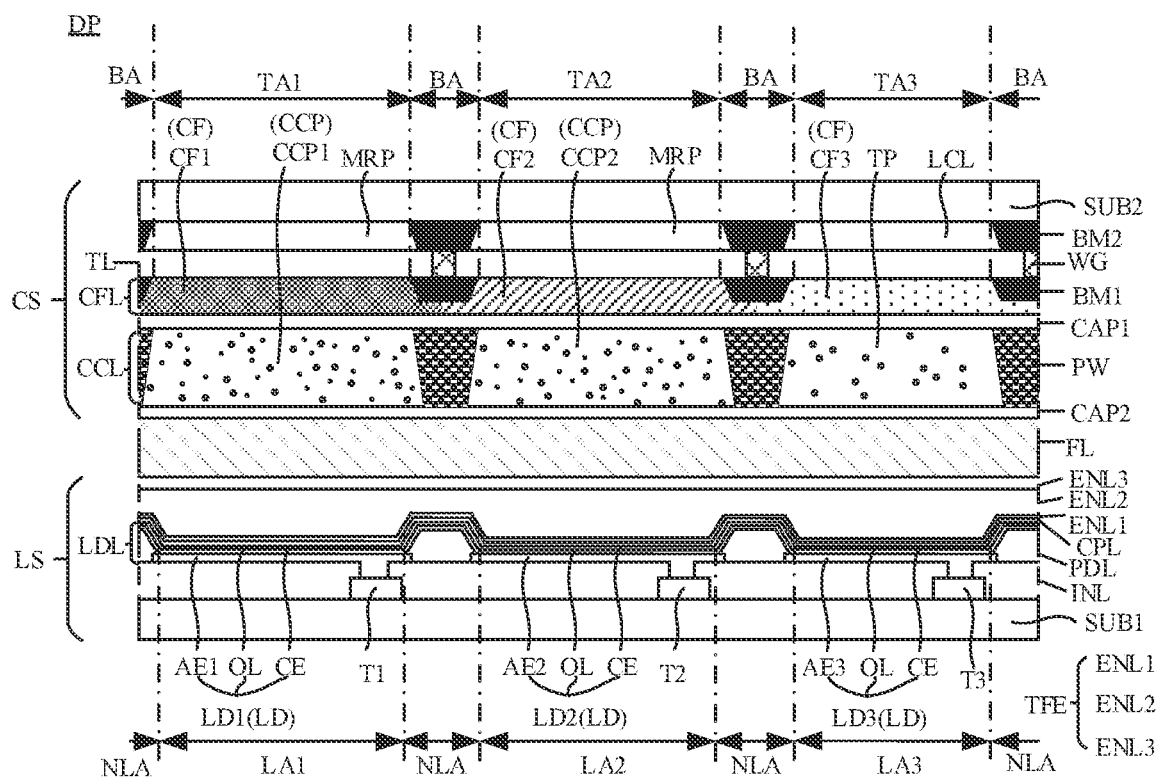
FIG. 6 is a section of a display panel, in accordance with some embodiments.

FIG. 6 is a schematic section of the display panel DP in embodiments of the present disclosure taken along the line A1-A1' in FIGS. 3 and 4. Some embodiments of the present disclosure provide a display panel DP. The display panel DP includes a plurality of light-emitting devices LD. The light-emitting device LD may be an organic light-emitting diode (OLED), a quantum dot light-emitting diode (QLED) and mini/micro light-emitting diodes (MLED). Embodiments of the present disclosure are described by taking an example where the light-emitting device LD is an OLED. However, it will be noted that embodiments of the present disclosure are not limited to a QD-OLED display panel. The OLED has advantages of small thickness, quick response, low driving voltage, wide operating temperature range, self-luminescence, and low power consumption, and is applicable to fabricate flexible devices.

As shown in FIG. 6, the display panel DP may include a light-emitting substrate LS, a color conversion substrate CS and a filling layer FL filled between the light-emitting substrate LS and the color conversion substrate CS.

In some embodiments, the light-emitting substrate LS may include a first base substrate SUB1, and switching elements T1, T2 and T3 that are disposed on the first base substrate SUB1.

The first base substrate SUB1 may be made of a light-transmitting material. For example, the first base substrate SUB1 may be inorganic glass, organic glass, a plastic substrate or other substrates of organic materials. The first base substrate SUB1 may be rigid or flexible. The first base substrate SUB1 may further include a buffer layer or an insulating layer, so that the first base substrate SUB1 has a substrate surface with good performances.

In a single repeating light-emitting region unit, switching elements include a first switching element T1, a second switching element T2 and a third switching element T3. For example, the first switching element T1 may be located in a first light-emitting region LA1, the second switching element T2 may be located in a second light-emitting region LA2, and the third switching element T3 may be located in a third light-emitting region LA3. For another example, at least one of the first switching element T1, the second switching element T2 and the third switching element T3 may be located in the non-light-emitting region NLA. At least one of the first switching element T1, the second switching element T2 and the third switching element T3 may be a thin film transistor including polysilicon or a thin film transistor including an oxide semiconductor. For example, when a switching element is the thin film transistor including the oxide semiconductor, the switching element may have a top-gate thin film transistor structure. The switching element may be connected to signal lines. The signal lines include but are not limited to a gate line, a data line and a power supply line.

The light-emitting substrate LS may further include an insulating layer INL. The insulating layer INL may be located on the first switching element T1, the second switching element T2 and the third switching element T3. The insulating layer INL may have a planarized surface. The insulating layer INL may be formed of an organic layer. For example, the insulating layer INL may be made of acrylic resin, epoxy resin, imide resin or ester resin. The insulating layer INL may have through holes exposing electrodes of the first switching element T1, the second switching element T2 and the third switching element T3, so as to realize electrical connection.

The light-emitting substrate LS may include a light-emitting device layer LDL located on the first base substrate SUB1. The light-emitting device layer LDL is provided therein with the plurality of light-emitting devices LD that are connected to the switching elements. In the single repeating light-emitting region unit, light-emitting devices LD include a first light-emitting device LD1, a second light-emitting device LD2 and a third light-emitting device LD3. For example, the first light-emitting device LD1 may be located in the first light-emitting region LA1, the second switching element T2 may be located in the second light-emitting region LA2, and the third switching element T3 may be located in the third light-emitting region LA3.

The first light-emitting device LD1 includes a first anode AE1. The second light-emitting device LD2 includes a second anode AE2. The third light-emitting device LD3 includes a third anode AE3. The first anode AE1, the second anode AE2 and the third anode AE3 may be disposed on the insulating layer INL. The first anode AE1 may be located in the first light-emitting region LA1, and be connected to the first switching element T1 through a through hole in the insulating layer INL. The second anode AE2 may be located in the second light-emitting region LA2, and be connected to the second switching element T2 through another trough hole in the insulating layer INL. The third anode AE3 may be located in the third light-emitting region LA3, and may be connected to the third switching element T3 through yet another through hole in the insulating layer INL. At least a portion of at least one of the first anode AE1, the second anode AE2 and the third anode AE3 may extend to the non-light-emitting region NLA. Widths of the first anode AE1, the second anode AE2 and the third anode AE3 may be same as or different from each other, and areas of the first anode AE1, the second anode AE2 and the third anode AE3 may be same as or different from each other. In some embodiments, the width of the first anode AE1 may be greater than the width of the second anode electrode AE2, and the width of the second anode electrode AE2 may be greater than the width of the third anode electrode AE3. In some other embodiments, the first anode AE1, the second anode AE2 and the third anode AE3 may be reflection electrodes. The first anode AE1, the second anode AE2 and the third anode AE3 may each be of a single-layer structure or a laminated structure, and may be made of metal such as Ag, Mg, Al, Pt, Pd, Au, Ni, Nd, Ir or Cr, or a mixture of these metals, or a conductive metal oxide material such as indium tin oxide (ITO), indium zinc oxide (IZO) or indium gallium zinc Oxide (IGZO).

The light-emitting substrate LS may further include a pixel defining layer PDL located on the first anode AE1, the second anode AE2 and the third anode AE3. The pixel defining layer PDL may include openings respectively exposing the first anode AE1, the second anode AE2 and the third anode AE3, and may respectively define the first light-emitting region LA1, the second light-emitting region LA2, the third light-emitting region LA3 and the non-light-emitting region NLA. A material of the pixel defining layer PDL may be at least one of organic insulating materials such as acrylic resin, epoxy resin, phenolic resin, polyamide resin, polyimide resin, unsaturated polyester resin, polyphenylene resin, polyphenylene sulfide resin and benzocyclobutene (BCB).

Figure 7:
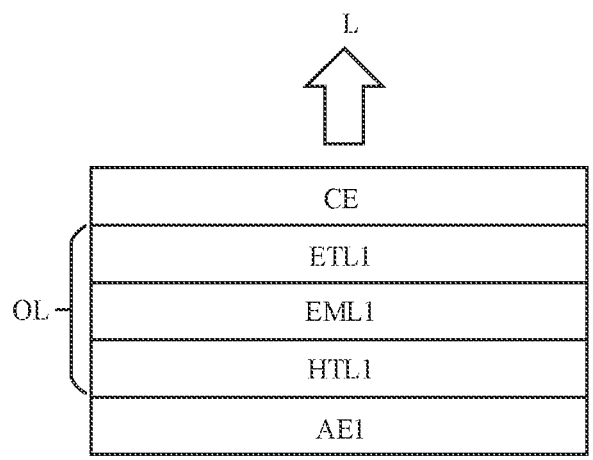
FIG. 7 is a structural diagram of a light-emitting device, in accordance with some embodiments.
Figure 8:
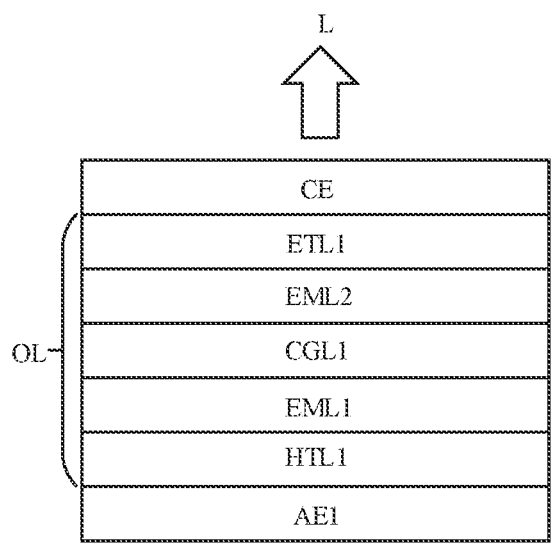
FIG. 8 is a structural diagram of another light-emitting device, in accordance with some embodiments.
Figure 9:
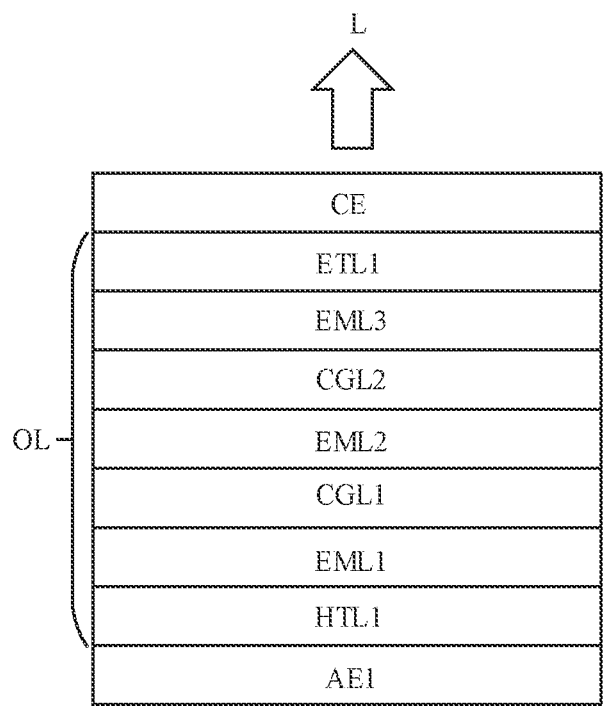
FIG. 9 is a structural diagram of yet another light-emitting device, in accordance with some embodiments.

As shown in FIGS. 7 to 9 of the present disclosure, the first light-emitting device LD1, the second light-emitting device LD2 and the third light-emitting device LD3 each further include a light-emitting layer OL. The light-emitting layers OL may be in a form of a continuous film formed in the light-emitting regions LA1, LA2, LA3, LA4, LA5 and LA6 and the non-light-emitting region NLA. The light-emitting layer OL may include a plurality of layers that are stacked.

In some embodiments, as shown in FIGS. 7 to 9, the light-emitting layer OL may include a first hole transport layer HTL1 located on the anode (the first anode AE1 merely serves as an example in FIGS. 7 to 9), a first light-emitting material layer EML1 located on the first hole transport layer HTL1, and a first electron transport layer ETL1 located on the first light-emitting material layer EML1. The first light-emitting material layer EML1 may be a blue light-emitting layer.

In some other embodiments, as shown in FIGS. 8 and 9 in addition to the first hole transport layer HTL1, the first light-emitting material layer EML1 and the first electron transport layer ETL1, the light-emitting layer OL may further include a first charge generation layer CGL1 located on the first light-emitting material layer EML1 and a second light-emitting material layer EML2 located on the first charge generation layer CGL1. The first electron transport layer ETL1 may be located on the second light-emitting material layer EML2. The second light-emitting material layer EML2 may, similarly to the first light-emitting material layer EML1, emit blue light. The second light-emitting material layer EML2 may emit blue light having a peak wavelength same as or different from that of the first light-emitting material layer EML1. Alternatively, the first light-emitting material layer EML1 and the second light-emitting material layer EML2 may emit light of different colors. For example, the first light-emitting material layer EML1 may emit blue light, and the second light-emitting material layer EML2 may emit green light.

In some yet other embodiments, as shown in FIG. 9, the light-emitting layer OL may further include a second charge generation layer CGL2 located on the second light-emitting material layer EML2 and a third light-emitting material layer EML3 located on the second charge generation layer CGL2. The first electron transport layer ETL1 may be located on the second light-emitting material layer EML2. The third light-emitting material layer EML3 may, similarly to the first light-emitting material layer EML1 or the second light-emitting material layer EML2, emit blue light. The third light-emitting material layer EML3 may emit blue light having a peak wavelength same as or different from that of the first light-emitting material layer EML1 and the second light-emitting material layer EML2. Alternatively, the first light-emitting material layer EML1, the second light-emitting material layer EML2 and the third light-emitting material layer EM3 may emit light of different colors. A structure of two or more light-emitting material layers may improve a light-emitting efficiency and lifetime of the light-emitting device LD. Those skilled in the art may determine a number of light-emitting material layers depending on needs, and embodiments of the present disclosure are not limited thereto.

There is a common cathode CE in the first light-emitting device LD1, the second light-emitting device LD2 and the third light-emitting device LD3. The cathode CE may be located on the light-emitting layers OL. The cathode CE may have semi-transmissive properties or transmissive properties. In some embodiments, the cathode CE may made of Ag, Mg, Cu, Al, Pt, Pd, Au, Ni, Nd, Ir, Cr, Li, Ca, LiF/Ca, LiF/Al, Mo or Ti, or a mixture or a compound thereof. For example, the cathode CE is made of a mixture of Ag and Mg. In some other embodiments, the cathode CE may be made of a transparent conductive oxide (TCO). For example, the cathode CE may be made of tungsten oxide ($W_xO_y$), titanium oxide ($TiO_2$), indium tin oxide (ITO), indium zinc oxide (IZO), zinc oxide (ZnO), indium tin zinc oxide (ITZO), magnesium oxide (MgO), or the like. In some embodiments, the light-emitting substrate LS may further include an auxiliary cathode (not shown in the figures). The auxiliary cathode may reduce a resistance of the cathode CE, thereby ameliorating an IR drop problem of the cathode and improving uniformity of a large-sized OLED light-emitting substrate.

In some embodiments, as shown in FIG. 6, the light-emitting substrate may include a light extraction layer CPL on a side of the plurality of light-emitting devices LD away from the first base substrate SUB1 to improve a light extraction efficiency. A material of the light extraction layer CPL is usually an organic material with a large refractive index and a small absorptivity. The light extraction layer CPL may be formed by vapor deposition of an organic small molecule material of 50 nm to 80 nm, inclusive.

The light-emitting substrate LS further includes a thin film encapsulation layer TFE disposed on the cathode CE. The thin film encapsulation layer TFE may be in a form of a continuous film formed in the light-emitting regions LA1, LA2, LA3, LA4, LA5 and LA6 and the non-light-emitting region NLA. The thin film encapsulation layer TFE may include a first encapsulation layer ENL1, a second encapsulation layer ENL2 and a third encapsulation layer ENL3 that are stacked. For example, the first encapsulation layer ENL1 and the third encapsulation layer ENL3 are made of an inorganic material. The inorganic material is at least one material selected from silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON) and lithium fluoride. For example, the second encapsulation layer ENL2 is made of an organic material. The organic material is at least one material selected from vinyl acid resin, methacrylic acid resin, polyisoprene, vinyl resin, epoxy resin, polyurethane resin, cellulose resin or perylene resin. Those skilled in the art may change a number of layers, the material and a structure of the thin film encapsulation layer TFE depending on needs, and embodiments of the present disclosure are not limit thereto.

In some embodiments, as shown in FIG. 6, the color conversion substrate CS may include a second base substrate SUB2, a color filter layer CFL, a partition wall PW and a color conversion layer CCL.

The second base substrate SUB2 may be made of a light-transmitting material. For example, the second base substrate SUB2 may be inorganic glass, organic glass, a plastic substrate or other substrates of organic materials. The second base substrate SUB2 may be rigid or flexible. The second base substrate SUB2 may further include a buffer layer or an insulating layer, so as to have a substrate surface with good performances.

The color filter layer CFL included in the color conversion substrate CS may be located on a side of the second base substrate SUB2. The color filter layer CFL is located on a side of the light-emitting device layer LDL away from the first base substrate SUB1. The color filter layer CFL includes a first light-shielding pattern BM1. The first light-shielding pattern BM1 may include a plurality of openings to define first light-transmitting regions TA1, second light-transmitting regions TA2, third light-transmitting regions TA3 and a light-blocking region BA. The first light-blocking pattern BM1 may be made of an organic light-blocking material, and is formed by a coating and exposure process. The first light-blocking pattern BM1 may prevent an occurrence of light interference due to a mixing of light from adjacent light-transmitting regions, thereby improving color reproducibility.

In a single repeating light-transmitting region unit, the color filter layer CFL further includes color filters CF located in multiple openings of the first light-shielding pattern BM1. The color filters CF may include a first color filter CF1 located in a first light-transmitting region TA1, a second color filter CF2 located in a second light-transmitting region TA2, and a third color filter CF3 located in a third light-transmitting region TA3. The first color filter CF1 may selectively transmit light of a first color (e.g., red light), and block or absorb light of a second color (e.g., green light) and light of a third color (e.g., blue light). The first color filter CF1 may be a red color filter, and may include a red colorant such as a red dye or a red pigment. The second color filter CF2 may selectively transmit light of the second color (e.g., green light) and block or absorb light of the first color (e.g., red light) and light of the third color (e.g., blue light). The second color filter CF2 may be a green color filter, and may include a green colorant such as green dye or a green pigment. The third color filter CF3 may selectively transmit light of the third color (e.g., blue light) and block or absorb light of the second color (e.g., green light) and light of the first color (e.g., red light). The third color filter CF3 may be a blue color filter, and may include a blue colorant such as a blue dye or a blue pigment. As used herein, it can be understood that the term "colorant" include either of a dye and a pigment. In some embodiments, first color filters CF1, second color filters CF2 and third color filters CF3 may be spaced apart from each other. In some embodiments, in adjacent rows $R_n$ and $R_{n+1}$, in a second direction DR2, first color filters CF1 of the same color located in a first light-transmitting region TA1 and a fourth light-transmitting region TA4 may be a continuous film layer.

The partition wall PW included in the color conversion substrate CS may be located on a side of the color filters CF away from the second base substrate SUB2. The partition wall PW is located in the light-blocking region BA and include a plurality of openings.

The color conversion layer CCL included in the color conversion substrate CS may be located on a side of the second base substrate SUB2. The color conversion layer CCL is located between the light-emitting device layer LDL and the color filter layer CFL. In a single repeating light-transmitting region unit, the color conversion layer CCL includes color conversion patterns CCP and a light-transmitting pattern TP that are located in multiple openings defined by the partition wall PW. The color conversion patterns CCP include a first color conversion pattern CCP1 and a second color conversion pattern CCP2.

Figure 10A:
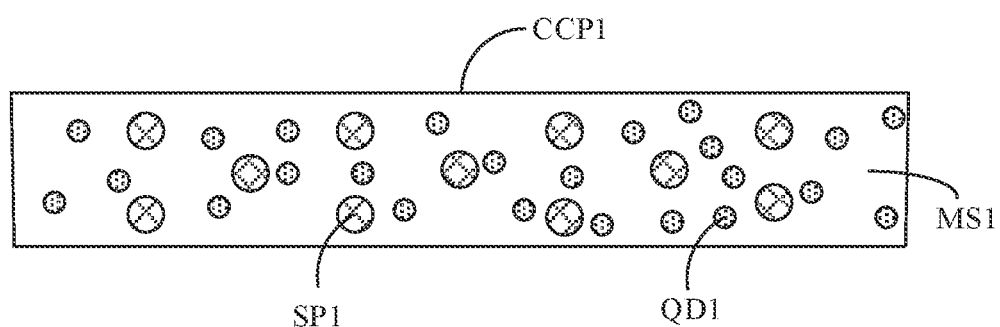
FIG. 10A is a structural diagram of a first color conversion pattern, in accordance with some embodiments.

The first color conversion pattern CCP1 can emit light by converting a peak wavelength of incident light into another specific peak wavelength, or by shifting a peak of the wavelength of the incident light to a position of a peak of the another specific wavelength. The first color conversion pattern CCP1 can convert light L emitted from a first light-emitting device LD1 into red light having a peak wavelength in a range of about 610 nm to about 650 nm, inclusive. As shown in FIG. 10A, the first color conversion pattern CCP1 may include a first base resin MS1, a first color conversion material QD1 dispersed in the first base resin MS1, and first scattering particles SP1 dispersed in the first base resin MS1. The first color conversion material QD1 is used for converting light emitted by the first light-emitting device LD1 into red light. The first scattering particles SP1, which have a scattering effect on light, are capable of diverging the light emitted by the first light-emitting device LD1 in the first color conversion pattern CCP1, so that the light emitted by the first light-emitting device LD1 may be fully converted by the first color conversion material QD1 of the first color conversion pattern CCP1, thereby improving an efficiency of conversion to red light.

Figure 10B:
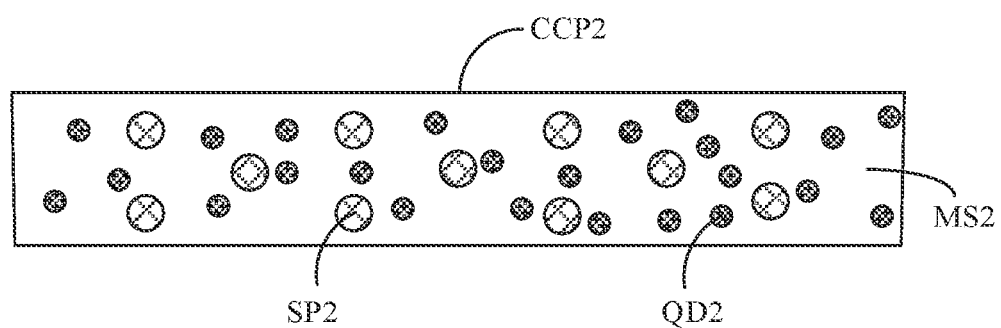
FIG. 10B is a structural diagram of a second color conversion pattern, in accordance with some embodiments.

The second color conversion patterns CCP2 can emit light by converting a peak wavelength of incident light into another specific peak wavelength, or by shifting a peak of the wavelength of the incident light to a position of a peak of the another specific wavelength. The second color conversion pattern 340 can convert light L emitted from a second light-emitting device LD2 into green light having a peak wavelength in a range of about 510 nm to about 550 nm, inclusive. As shown in FIG. 10B, the second color conversion pattern CCP2 may include a second base resin MS2, a second color conversion material QD2 dispersed in the second base resin MS2, and scattering particles SP2 dispersed in the second base resin MS2. The second color conversion material QD2 is used for converting the light emitted by the second light-emitting device LD2 into green light. The second scattering particles SP2, which have a scattering effect on light, are capable of diverging the light emitted by the second light-emitting device LD2 in the second color conversion pattern CCP2, so that the light emitted by the second light-emitting device LD2 may be fully converted by the second color conversion material QD2 in the second color conversion pattern CCP2, thereby improving an efficiency of conversion to green light.

The scattering particles SP1 and SP2 may be inorganic materials or organic materials. For example, the scattering particles SP1 and SP2 may include hollow silica, aerogels or porous particles. For example, the porous particles may be inorganic particles or organic particles, which include a plurality of amorphous pores. The porous particles may include at least one type of $TiO_2$, $ZrO_2$, $Al_2O_3$, $In_2O_3$, ZnO, $SnO_2$, $Sb_2O_3$ and ITO.

The first color conversion material QD1 and the second color conversion material QD2 may each include a semiconductor nanocrystalline material, i.e., quantum dots. The quantum dot can emit light of a specific color in a case where an electron transitions from a conduction band to a valence band. The quantum dot may have any shape, as long as the shape is used in the art. For example, the quantum dot may be a spherical nanoparticle, a conical nanoparticle, a multi-walled nanoparticle or a cubic nanoparticle, or may be a nanotube, a nanowire, or a nanofiber.

In some embodiments, the quantum dot may have a core-shell structure. The core-shell structure includes a core material and a shell material. The core-shell structure includes a core of a nanocrystal and a shell surrounding the core. The shell of the quantum dot may act as a protective layer for preventing chemical modification of the core from being damaged and maintaining semiconductor characteristics, and/or act as a charging layer for imparting electrophoretic properties to the quantum dot. The shell may have a single-layer structure or a multi-layer structure. The inner layer of the shell in contact with the core may have a concentration gradient where the concentration of an element of the shell decreases towards the center of the core. The core of the quantum dot may be any compound selected from a group II-VI compound, a group III-V compound, a group IV-VI compound, a group IV element and a group IV compound, and combinations thereof. The shell of the quantum dot may include one of an oxide of a metallic material, an oxide of a non-metallic material, a semiconductor compound, and combinations thereof. A transition material may be provided between the core material and the shell material to realize gradual transition of lattice, which effectively reduces an internal pressure caused by a lattice defect of the quantum dot, thereby further improving luminous efficiency and stability of the quantum dot.

In some embodiments, the group II-VI compound may be any compound selected from CdSe, CdTe, ZnS, ZnSe, ZnTe, ZnO, HgS, HgSe, HgTe, MgSe, and MgS and mixtures thereof, or may be any compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS and mixtures thereof, or may be any compound selected from HgZnTeS, CdZnSeS, CdZnSeTe, CdZnSTe, CdHgSeS, CdHgSeTe, CdHgSTe, HgZnSeS, HgZnSeTe, and HgZnSTe and mixtures thereof.

In some embodiments, the group III-V compound may be any compound selected from GaN, GaP, GaAs, GaSb, AlN, AlP, AlAs, AlSb, InN, InP, InAs, and InSb and mixtures thereof, or may be any compound selected from GaNP, GaNAs, GaNSb, GaPAs, GaPSb, AlNP, AlNAs, AlNSb, AlPAs, AlPSb, InGaP, InNAs, InNP, InNAs, InNSb, InPAs, and InPSb and mixtures thereof; or may be any compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb and mixtures thereof.

In some embodiments, the group III-V compound may be any compound selected from GaN, GaP, GaAs, GaSb, AlN, AlP, AlAs, AlSb, InN, InP, InAs, and InSb and mixtures thereof, or may be any compound selected from GaNP, GaNAs, GaNSb, GaPAs, GaPSb, AlNP, AlNAs, AlNSb, AlPAs, AlPSb, InGaP, InNAs, InP, InNAs, InNSb, InPAs, and InPSb and mixtures thereof, or may be any compound selected from GaAlNP, GaAlNAs, GaAlNSb, GaAlPAs, GaAlPSb, GaInNP, GaInNAs, GaInNSb, GaInPAs, GaInPSb, InAlNP. InAlNAs, InAlNSb, InAlPAs, and InAlPSb and mixtures thereof.

In some embodiments, the transition material may be a ternary alloy material. By controlling optical properties of the quantum dot through the ternary alloy material, it may be possible to generate quantum dots with the substantially same volume and different emission frequencies, which improves a color domain coverage of the display apparatus.

In some embodiments, the core material of the quantum dot includes CdSe and/or InP, and the shell material includes ZnS. Considering an example where the core material includes InP, surface defects of the InP quantum dot form surface trap states. By coating a surface of the InP quantum dot with ZnS to form a core-shell structure with InP as the core material and ZnS as the shell material, the surface defects of the quantum dot may be reduced, which improves the luminous efficiency and the stability of the quantum dot. The description above is merely an example where the core material includes InP. In a case where the core material includes CdSe, or the core material includes CdSe and InP, the above principles also apply.

In some embodiments, the quantum dot does not include cadmium (Cd). For example, the core material of the quantum dot is InP, and the shell material is a laminated layer of ZnSe and ZnS (ZnSe/ZnS). For another example, the core material of the quantum dots is ZnTeSe, and the shell material is ZnSe and Zn (ZnSe/ZnS).

The quantum dot may have a size less than 45 nm, such as 40 nm, 30 nm, 20 nm or less. In some embodiments, the size of the quantum dot is in a range of 4 nm to 20 nm, inclusive. For example, the size of the quantum dot may be 4 nm, 5 nm, 7 nm, 10 nm, 13 nm, 17 nm or 20 nm. A color of light emitted by the quantum dot may be adjusted through changing the size thereof, so that the quantum dot may emit light of various colors, such as blue light, red light and green light. A size of a red quantum dot may be different from a size of a green quantum dot.

In some embodiments, a thickness of the color conversion layer CCL is in a range of 5 μm to 12 μm, inclusive. A thickness of the first color conversion pattern CCP1 and/or a thickness of the second color conversion pattern CCP2 is in a range of 5 μm to 30 μm, inclusive. That is, at least one of the thickness of the first color conversion pattern CCP1 and/or the thickness of the second color conversion pattern CCP2 is in the range of 5 μm to 30 μm, inclusive. For example, the thickness in the range of 5 μm to 30 μm may be 5 μm, 10 μm, 15 μm, 18 μm, 21 μm, 25 μm, 28 μm or 30 μm. The thicknesses of the first color conversion pattern CCP1 and the thicknesses of the second color conversion pattern CCP2 may be same as or different from each other.

Figure 11:
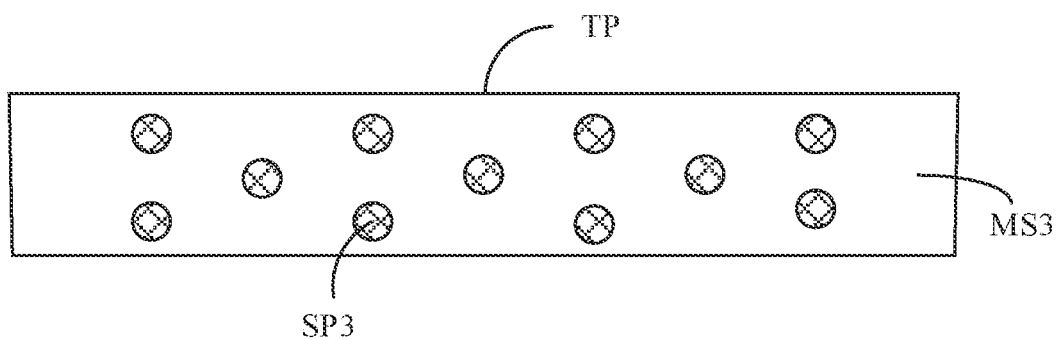
FIG. 11 is a structural diagram of a light-transmitting pattern, in accordance with some embodiments.

As shown in FIG. 11, a light-transmitting pattern TP may include a third base resin MS3 and third scattering particles SP3 dispersed in the third base resin MS3.

The first color conversion patterns CCP1, the second color conversion patterns CCP2 and the light-transmitting patterns TP may be formed by an inkjet method using an ink composition. The partition wall PW in the color conversion substrate CS may be stably positioned at a desired position to serve as a guide element of the ink composition for forming the first color conversion patterns CCP1, the second color conversion patterns CCP2 and the light-transmitting patterns TP.

As shown in FIG. 6, the color conversion substrate CS may further include a first cover layer CAP1 covering the first color filters CF1, the second color filters CF2 and the third color filters CF3. That is, the first cover layer CAP1 is located on a side, facing the light-emitting substrate LS, of the first color filters CF1, the second color filters CF2 and the third color filters CF3. The first cover layer CAP1 is in direct contact with the first color filters CF1, the second color filters CF2 and the third color filters CF3. The first cover layer CAP1 may avoid contamination or damage on the first color filters CF1, the second color filters CF2 and the third color filters CF3 due to penetration of impurities such as moisture or air from outside. The first cover layer CAP1 may further prevent contamination or damage on the first color conversion patterns CCP1 and the second color conversion patterns CCP2 due to penetration of impurities such as moisture or air from outside. The first cover layer CAP1 may further prevent colorants included in the first color filters CF1, the second color filters CF2 and the third color filters CF3 from diffusing to other components such as the first color conversion patterns CCP1 and the second color conversion patterns CCP2. The first cover layer CAP1 may be made of an inorganic material. For example, the first cover layer CAP1 may be made of at least one of silicon nitride, aluminum nitride, zirconium nitride, titanium nitride, hafnium nitride, tantalum nitride, silicon oxide, aluminum oxide, titanium oxide, tin oxide, cerium oxide or silicon oxynitride.

As shown in FIG. 6, the color conversion substrate CS may further include a second cover layer CAP2 covering the first color conversion patterns CCP1, the second color conversion patterns CCP2 and the light-transmitting patterns TP. That is, the second cover layer CAP2 is located on a side, facing the light-emitting substrate LS, of the first color conversion patterns CCP1, the second color conversion patterns CCP2 and the light-transmitting patterns TP. In this case, the second cover layer CAP2 may prevent contamination or damage on the first color conversion patterns CCP1, the second color conversion patterns CCP2 and the light-transmitting patterns TP due to penetration of impurities such as moisture or air from outside. The second cover layer CAP2 may be made of an inorganic material. The second cover layer CAP2 may be made of the same material as the first cover layer CAP1, or some of materials for making the second cover layer CAP2 may be included in the materials of the first cover layer CAP1. For example, the second cover layer CAP2 may be made of at least one of silicon nitride, aluminum nitride, zirconium nitride, titanium nitride, hafnium nitride, tantalum nitride, silicon oxide, aluminum oxide, titanium oxide, tin oxide, cerium oxide or silicon oxynitride.

In some embodiments, as shown in FIG. 6, the display panel DP may further include a touch function layer TL located between the second base substrate SUB2 and the color conversion layer CCL. The touch function layer TL may be a self-capacitance touch function layer or a mutual-capacitance touch function layer.

Figure 12:
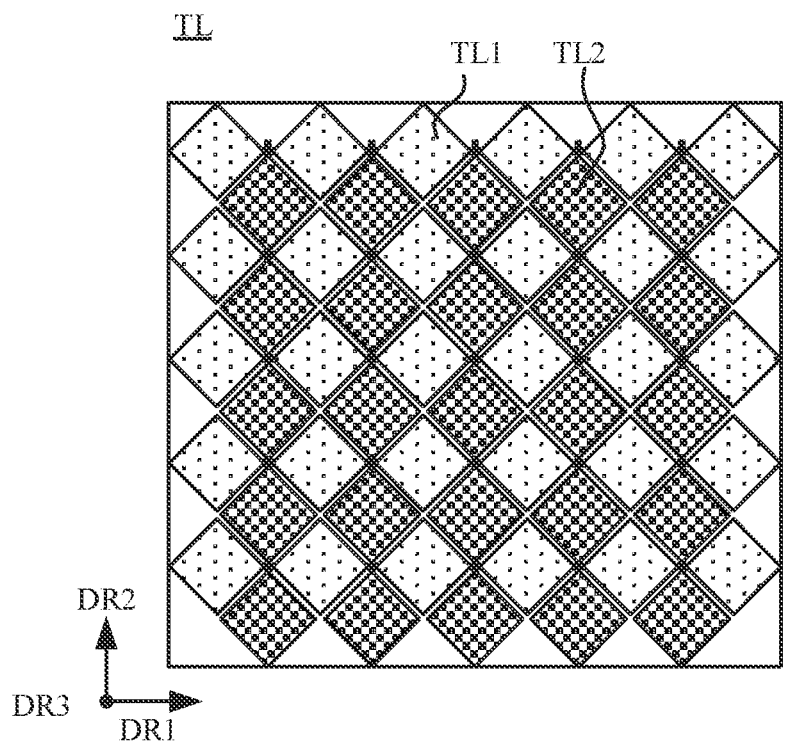
FIG. 12 is a top view of a touch function layer, in accordance with some embodiments.

As shown in FIG. 12, the mutual-capacitance touch function layer TL includes a plurality of touch driving electrodes TL1 and a plurality of touch sensing electrodes TL2, which are arranged in an array. The touch function layer TL further includes touch driving lines arranged in the first direction DR1 and touch sensing lines arranged in the second direction DR2. A single touch driving line corresponds to a single row of touch driving electrodes TL1, and a single touch sensing line corresponds to a single column of touch sensing electrodes TL2. Capacitances exist between the touch driving electrodes TL1 and the touch sensing electrodes TL2. Touch scanning signals are input to the touch driving lines, a sensing signal on each touch sensing line is acquired, and a position of a touch point is determined according to a position where a capacitance changes.

Figure 13:
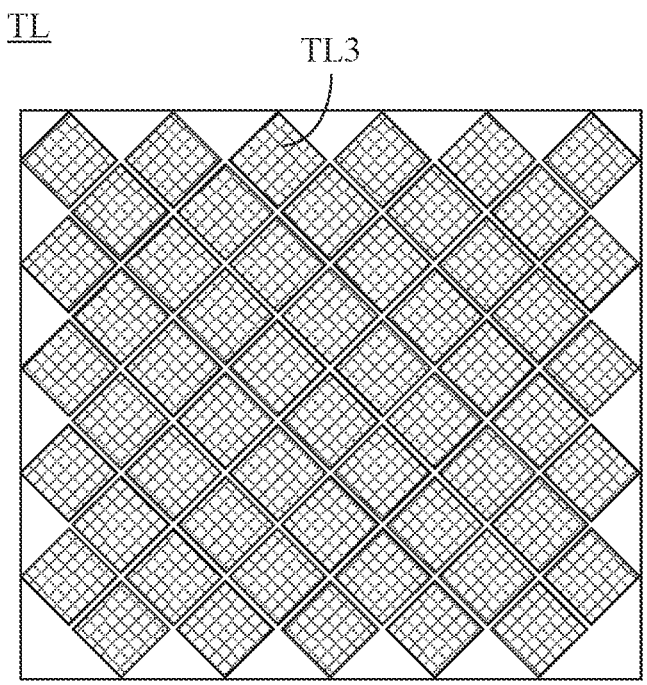
FIG. 13 is a top view of another touch function layer, in accordance with some embodiments.

As shown in FIG. 13, the self-capacitive touch function layer TL includes a plurality of touch units TL3 arranged in an array. Each touch unit TL3 is connected to an integrated circuit IC through a respective signal line. A capacitance may exist between the touch unit TL3 and a reference voltage terminal of a system (e.g., a ground signal terminal GND). A touch scanning signal is input to each signal line, and a sensing signal on each signal line is acquired, a position where the capacitance changes is determined according to the sensing signal on each signal line, and then a position of the touch point is determined.

It will be noted that, the touch driving electrodes, the touch sensing electrodes and the touch units in the touch function layers TL all have a metal mesh structure. As shown in FIG. 6, the metal mesh structure WG is located in the light-blocking region BA, so that adverse effects on outgoing light from, for example, the light-transmitting regions TA1, TA2, and TA3, are avoided.

Figure 15:
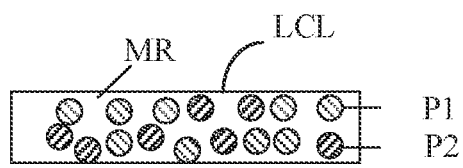
FIG. 15 is a structural diagram of a light conversion layer, in accordance with some embodiments.

With continued reference to FIG. 6, display panel DP may further include a light adjustment layer LCL located between the second base substrate SUB2 and the touch function layer TL. The light adjustment layer LCL is used for adjusting outgoing light passing through the touch function layer TL. As shown in FIG. 15, the light adjustment layer LCL includes first particles P1 and second particles P2. The first particle P1 may be a dye molecule, and the second particle P2 may be a particle having a hollow structure. For example, the first particles P1 are blue dye molecules. The blue dye molecules can diffuse blue light emitted from the third light-transmitting regions TA3, thereby expanding a display viewing angle of the blue light in the display panel DP.

The first particles P1 are located in the third light-transmitting regions TA3, and a color of the dye molecules and a color of the third light-emitting devices LD3 may be same, so as to form a color same as a color of third sub-pixels PX3.

The hollow particle may include a core portion filled with air and a shell portion surrounding the core portion. The hollow particle is in a shape of a sphere with an average diameter of about 10 nm to about 200 nm, inclusive. For example, the average diameter may be 10 nm, 33 nm, 59 nm, 123 nm, 150.3 nm, 188.8 nm or 200 nm. The shell portion may be made of an inorganic material. The inorganic material includes at least one of $SiO_2$, $MgF_2$, $TiO_2$, $ZrO_2$, $Al_2O_3$, $In_2O_3$, $ZnO$, $SnO_2$, $Sb_2O_3$, $Fe_3O_4$ and ITO. For example, the material of the shell portion only includes $SiO_2$. For another example, the material of the shell portion includes $TiO_2$ and $ZrO_2$. For yet another example, the material of the shell portion includes $In_2O_3$, $ZnO$, $SnO_2$ and $Sb_2O_3$. Alternatively, the shell portion may be made of an organic material. In this case, the shell portion has a low dielectric constant, which may prevent a surface thereof from being charged, thereby avoiding adverse effects on the touch function layer TL. For example, the material of the shell portion may include at least one of acrylic polymer, polyimide, urethane polymer, styrene-based polymer, siloxane-based polymer and epoxy-based polymer. For example, the material of the shell portion only includes polyimide. For another example, the material of the shell portion includes urethane polymer and styrene polymer. For yet another example, the material of the shell portion includes acrylic polymer, siloxane polymer and epoxy-based polymer.

A mass fraction of hollow particles may be in a range of 30% to 60%, inclusive. For example, the mass fraction is 30%, 36%, 42%, 48.8%, 52% or 60%. A resin mixture doped with the hollow particles is capable of having a small refractive index and a large transmittance. For example, the resin mixture has a transmittance of 95% or greater at wavelengths of 400 nm to 700 nm and a refractive index of 1.1 to 1.5 at a wavelength of 632 nm. A transparent matrix material is dope with the hollow particles, and disposed on a light exit side of the color conversion layer CCL, so that an overall refractive index of organic transparent materials in at least one light-transmitting region is reduced to an optimal refractive index for light outgoing, thereby improving the luminous efficiency.

Figure 29:
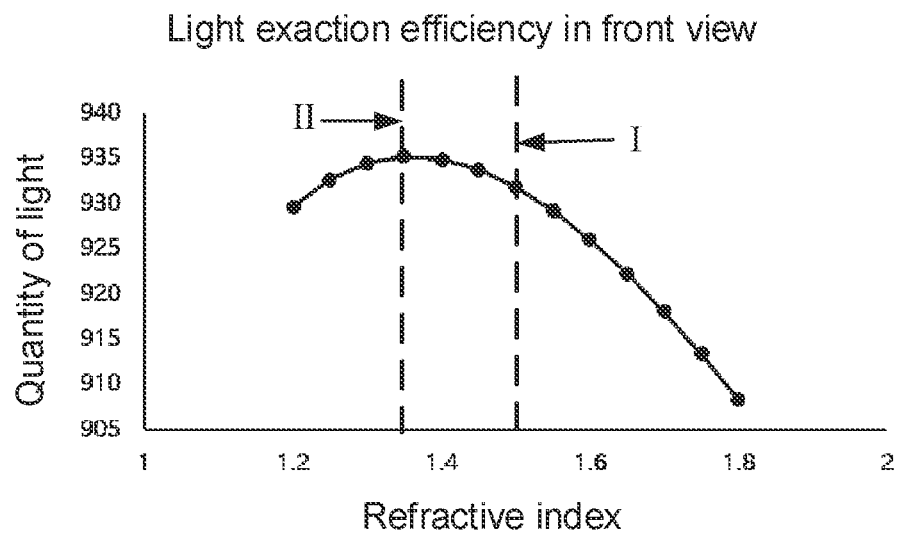
FIG. 29 is a comparison diagram of light extraction efficiencies in front view under different refractive indexes.

For example, as shown in FIG. 29, an overall refractive index I of transparent materials without doping with the hollow particles located on the light exit side of the color conversion layer is about 1.5; while, after the transparent matrix material is doped with the hollow particles, the overall refractive index II of the organic transparent materials located on the light exit side of the color conversion layer is about 1.35. Compared with the solution without doping, the light extraction efficiency may be improved by about 6.4%.

As shown in FIG. 6, the light adjustment layer LCL further includes a second light-shielding pattern BM2 that is located in the light-blocking region BA. The second light-shielding pattern BM2 may have a same planar arrangement pattern as the first light-shielding pattern BM1. The second light-shielding pattern BM2 may prevent the occurrence of light interference due to a mixing of light from the adjacent light-transmitting regions where light is mixed, thereby improving the color reproducibility.

In some embodiments, as shown in FIG. 6, the light adjustment layer LCL is only located in the third light-transmitting regions TA3. In other words, an orthographic projection of the light adjustment layer LCL on the first base substrate SUB1 only overlaps with the third light-transmitting regions TA3. For example, the third light-transmitting regions TA3 are configured to transmit blue light. Transparent resin filling patterns MRP are provided in regions, which are located in a same layer as the light adjustment layer LCL, and in the first light-transmitting regions TA1 and the second light-transmitting regions TA2. The transparent resin filling pattern MRP may be made of a matrix such as a transparent resin material.

Figure 14:
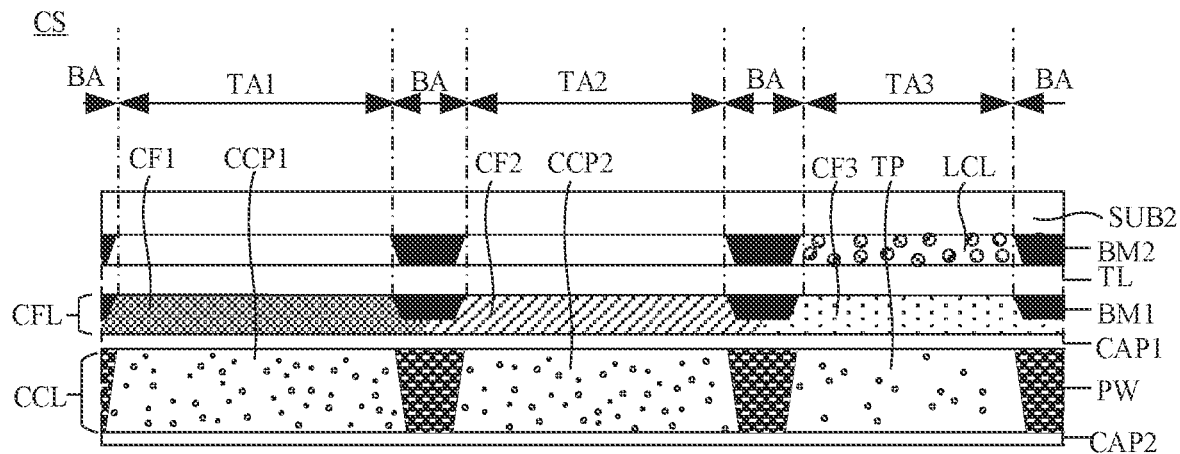
FIG. 14 is a section of a color conversion substrate, in accordance with some embodiments.

FIG. 14 is an illustration of the color conversion substrate of the display panel in the embodiments shown in FIG. 6. As shown in FIG. 14, the light adjustment layer LCL has a single-layer structure, and includes a mixture of the first particles P1 and the second particles P2. FIG. 15 is an enlarged diagram of the light adjustment layer LCL in FIG. 14. Here, as shown in FIG. 15, the first particles P1 and the second particles P2 are uniformly mixed in a matrix MR thereof. A material of the matrix MR includes at least one of an acrylic polymer, a polysiloxane-based polymer, a urethane-based polymer and an imide-based polymer.

Figure 16:
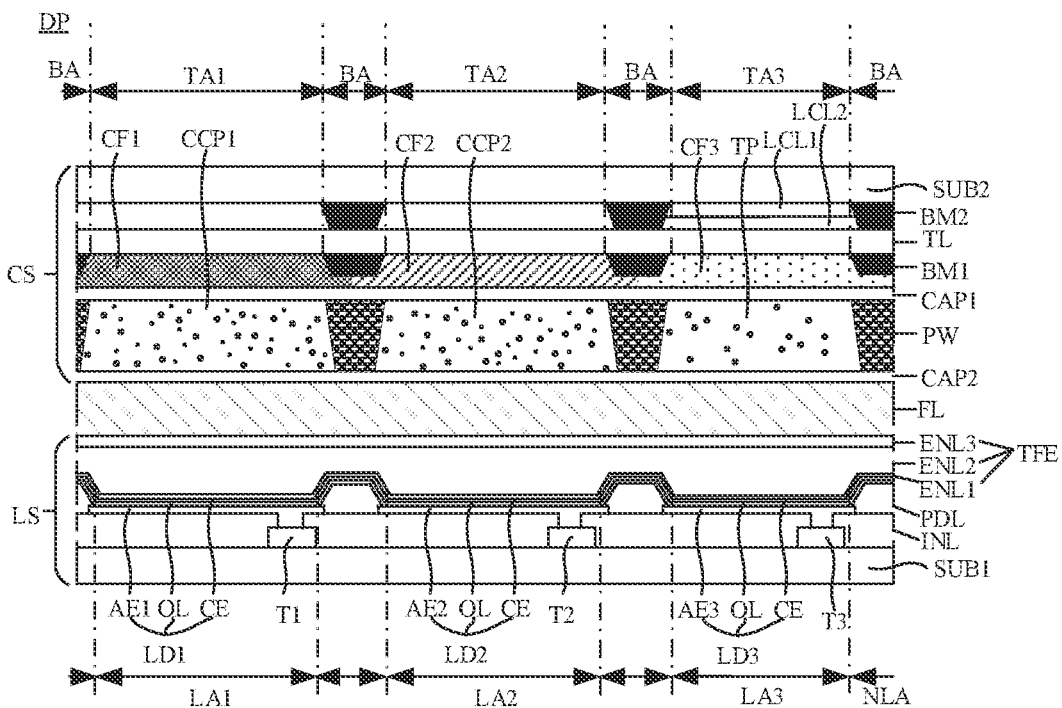
FIG. 16 is a section of another display panel, in accordance with some embodiments.

FIG. 16 is a diagram showing a structural variation of the display panel in the embodiments shown in FIG. 6. As shown in FIG. 16, the light adjustment layer LCL has a laminated structure, and includes a first light adjustment layer LCL1 and a second light adjustment layer LCL2. The first light adjustment layer LCL1 includes the first particles P1, and the second light adjustment layer LCL2 includes the second particles P2. The first light adjustment layer LCL1 is located on a side of the second base substrate SUB2, and the second light adjustment layer LCL2 is located on a side of the first light adjustment layer LCL1 away from the second base substrate SUB2. In a case where the display panel DP is used for touch control, the first light adjustment layer LCL1 may act as a buffer to prevent the hollow structures of the second particles P2 in the second light adjustment layer LCL2 below from being broken by pressing.

A thickness of the first light adjustment layer LCL1 and a thickness of the second light adjustment layer LCL2 may be same as or different from each other. The thickness of the first light adjustment layer LCL1 and the thickness of the second light adjustment layer LCL2 may each be in a range of 2 μm to 5 μm, inclusive. For example, the thickness may be 2 μm, 3 μm, 4.2 μm, 4.8 μm or 5 μm.

For example, the first particles P1 included in the first light adjustment layer LCL1 are blue dye molecules, so that light is diffused, which expands the display viewing angle. For example, the second particles P2 included in the second light adjustment layer LCL2 are hollow particles, so that a refractive index of the color conversion layer on the light exit side is reduced, which improves the light extraction efficiency. The first light adjustment layer LCL1 may only be located in the third light-transmitting regions TA3. In other words, an orthographic projection of the first light adjustment layer LCL1 on the first base substrate SUB1 only overlaps with the third light-transmitting regions TA3.

Figure 17:
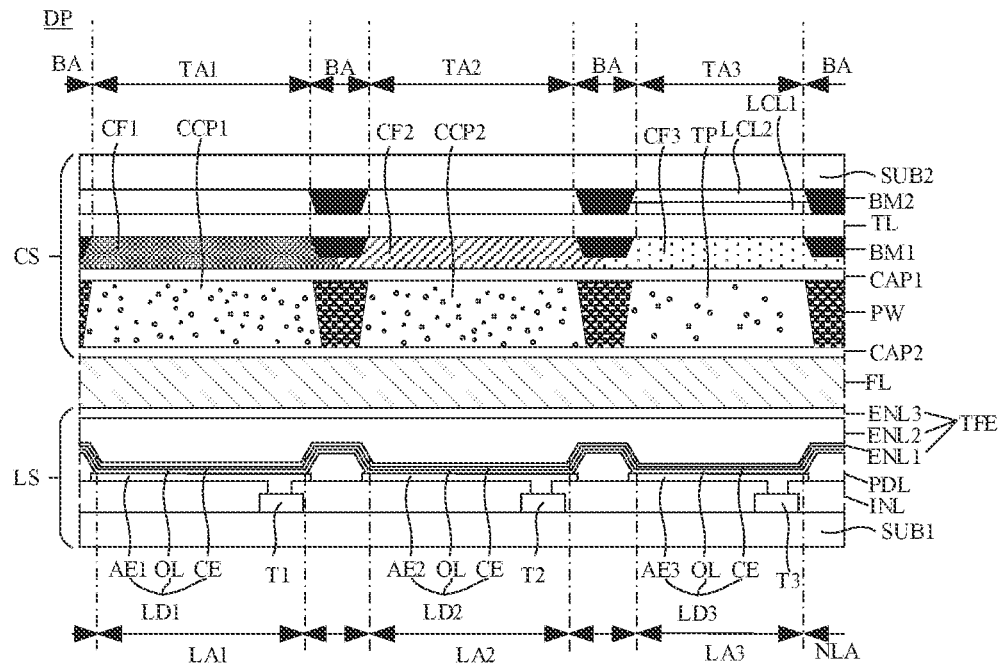
FIG. 17 is a section of yet another display panel, in accordance with some embodiments.

FIG. 17 is a diagram showing another structural variation of the display panel in the embodiments shown in FIG. 6. As shown in FIG. 17, the light adjustment layer LCL has a laminated structure, and includes a first light adjustment layer LCL1 and a second light adjustment layer LCL2. The first light adjustment layer LCL1 includes the first particles P1, and the second light adjustment layer LCL2 includes the second particles P2. The second light adjustment layer LCL2 is located on a side of the second base substrate SUB2, and the first light adjustment layer LCL1 is located on a side of the second light adjustment layer LCL2 away from the second base substrate SUB2. The first light adjustment layer LCL1 may only be located in the third light-transmitting regions TA3. In other words, an orthographic projection of the first light adjustment layer LCL1 on the first base substrate SUB1 only overlaps with the third light-transmitting regions TA3.

Figure 18:
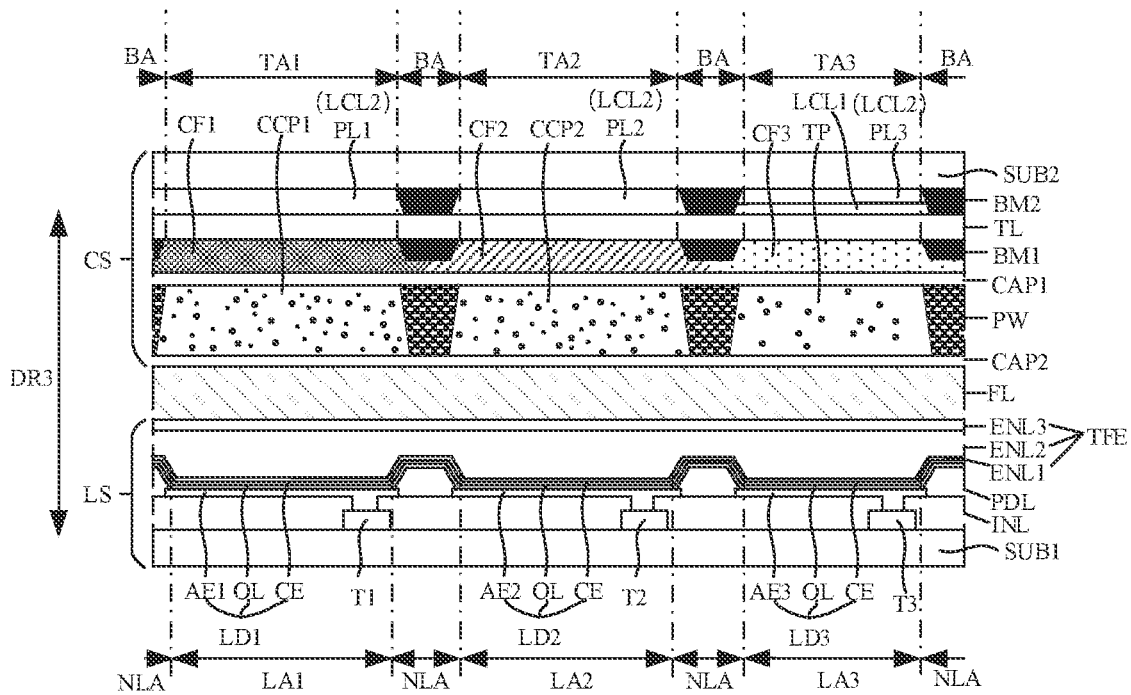
FIG. 18 is a section of yet another display panel, in accordance with some embodiments.

FIG. 18 is a section diagram of the display panel DP in some other embodiments of the present disclosure taken along the line A1-A1' in FIGS. 3 and 4. As shown in FIG. 18, the light adjustment layer LCL has a laminated structure, and includes a first light adjustment layer LCL1 and a second light adjustment layer LCL2. The first light adjustment layer LCL1 is located on a side of the second base substrate SUB2, and the second light adjustment layer LCL2 is located on a side of the first light adjustment layer LCL1 away from the second base substrate SUB2. The first light adjustment layer LCL1 includes the first particles P1, and the second light adjustment layer LCL2 includes the second particles P2. The first light adjustment layer LCL1 and the second light adjustment layer LCL2 have island-shaped patterns. The first light adjustment layer LCL1 is only located in the third light-transmitting regions TA3, and the second light adjustment layer LCL2 is located in the first light-transmitting regions TA1, the second light-transmitting regions TA2 and the third light-transmitting regions TA3. A thickness of the second light-shielding pattern BM2 located in the light-blocking region BA may be approximately equal to a sum of thicknesses of a portion of the first light adjustment layer LCL1 and a portion of the second light adjustment layer LCL2 that are located in a third light-transmitting region TA3, and may be equal to a thickness of a portion of the second light adjustment layer LCL2 located in a first light-transmitting region TA1 and a thickness of a portion of the second light adjustment layer LCL2 located in a second light-transmitting region TA2, so as to provide a flat surface for subsequent processes.

The second light adjustment layer LCL2 includes a plurality of first patterns PL1, a plurality of second patterns PL2 and a plurality of third patterns PL3 that are separated from each other. The first pattern PL1, the second pattern PL2 and the third pattern PL3 may each include second particles P2. The first patterns PL1 are located in the first light-transmitting regions TA1, the second patterns PL2 are located in the second light-transmitting regions TA2, and the third patterns PL3 are located in the third light-transmitting regions TA3. The thickness of the second light-shielding pattern BM2 in a direction DR3 perpendicular to the display panel DP is approximately equal to a thickness of a first pattern PL1 in the direction DR3 perpendicular to the display panel DP and/or a thickness of a second pattern PL2 in the direction DR3 perpendicular to the display panel DP, and is also approximately equal to a sum of a thickness of a third pattern PL3 in the direction DR3 perpendicular to the display panel DP and a thickness of a thickness of the first light adjustment layer LCL1 in the direction DR3 perpendicular to the display panel DP. The first pattern PL1, the second pattern PL2 and the third pattern PL3 are each doped with the second particles P2 of a different mass fraction. By adjusting a doping concentration of the second particles P2, an overall refractive index of the transparent materials on the light exit side of the color conversion layer CCL may be adjusted, thereby improving the light extraction efficiency.

Figure 19:
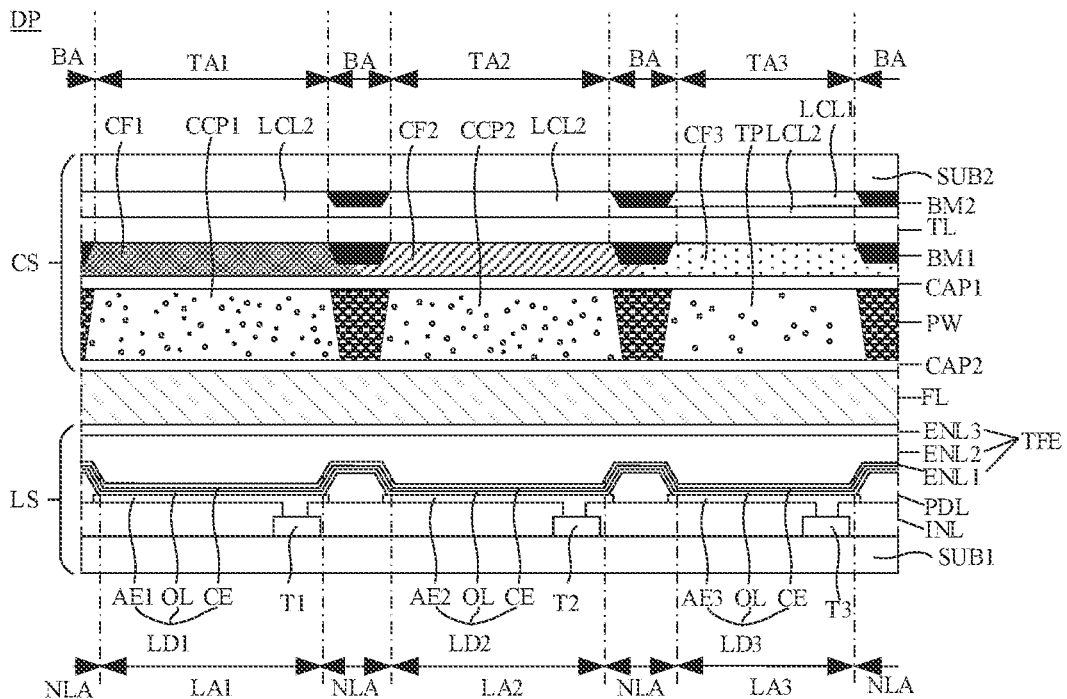
FIG. 19 is a section of yet another display panel, in accordance with some embodiments.

FIG. 19 is a diagram showing a structural variation of the display panel DP in the embodiments shown in FIG. 18. As shown in FIG. 19, the first light adjustment layer LCL1 is only located in the third light-transmitting regions TA3, the second light adjustment layer LCL2 has a continuous film layer structure and covers the first light-transmitting regions TA1, the second light-transmitting regions TA2, the third light-transmitting regions TA3 and the light-blocking region BA. A thickness of the second light-shielding pattern BM2 may be approximately equal to a thickness of the first light adjustment layer LCL1 and less than a thickness of a portion, located in the first light-transmitting regions TA1 and the second light-transmitting regions TA2, of the second light adjustment layer LCL2.

Figure 20:
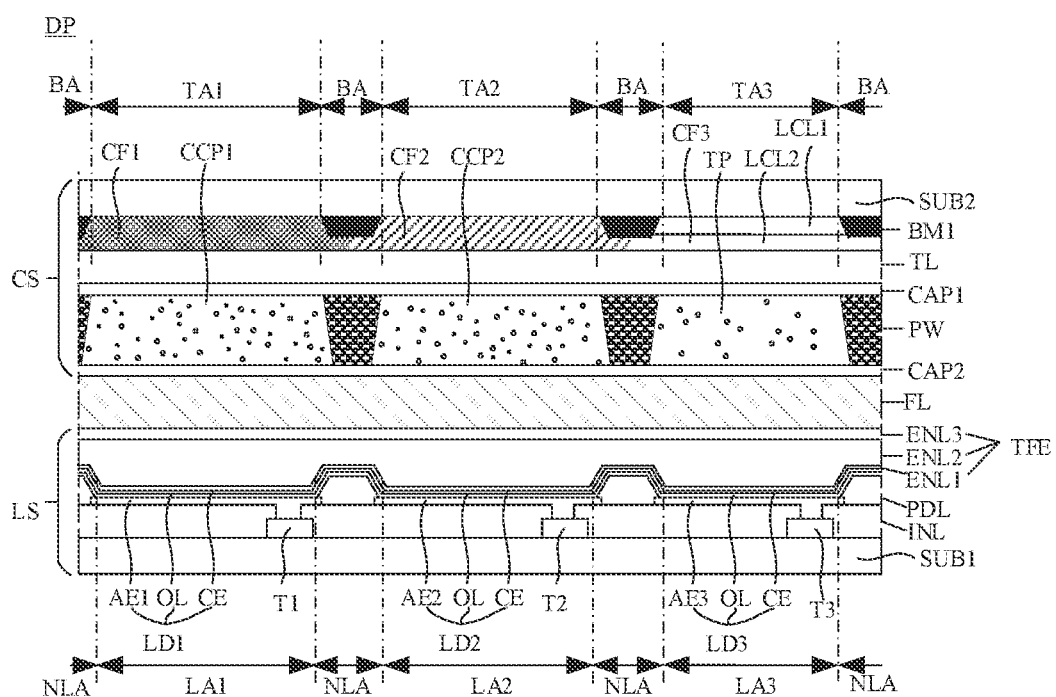
FIG. 20 is a section of yet another display panel, in accordance with some embodiments.

FIG. 20 is a section diagram of the display panel DP in yet some other embodiments of the present disclosure taken along the line A1-A1' in FIGS. 3 and 4. As shown in FIG. 20, the light adjustment layer LCL and the color filter layer CF are disposed in a same layer. The light adjustment layer LCL has a laminated structure, and includes a first light adjustment layer LCL1 and a second light adjustment layer LCL2. The first light adjustment layer LCL1 is located on a side of the second base substrate SUB2, and the second light adjustment layer LCL2 is located on a side of the first light adjustment layer LCL1 away from the second base substrate SUB2. The first light adjustment layer LCL1 includes the first particles P1, and the second light adjustment layer LCL2 includes the second particles P2. The light adjustment layer LCL is located in the third light-transmitting regions TA3. In a case where the display panel DP is used for touch control, the first light adjustment layer LCL1 may act as a buffer to prevent the hollow structures of the second particles P2 in the second light adjustment layer LCL2 below from being broken by pressing.

Figure 21:
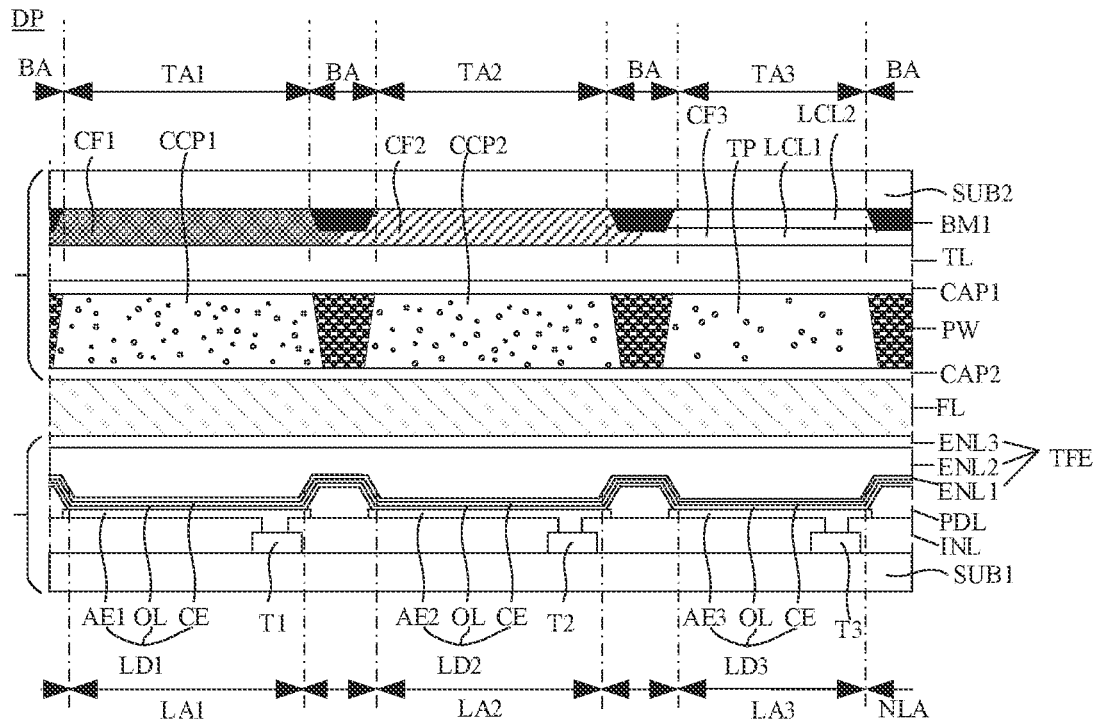
FIG. 21 is a section of yet another display panel, in accordance with some embodiments.

FIG. 21 is a diagram showing a structural variation of the display panel DP in the embodiments shown in FIG. 20. As shown in FIG. 21, positions of the first light adjustment layer LCL1 and the second light adjustment layer LCL2 may be exchanged, and embodiments of the present disclosure are not limited thereto.

Figure 22:
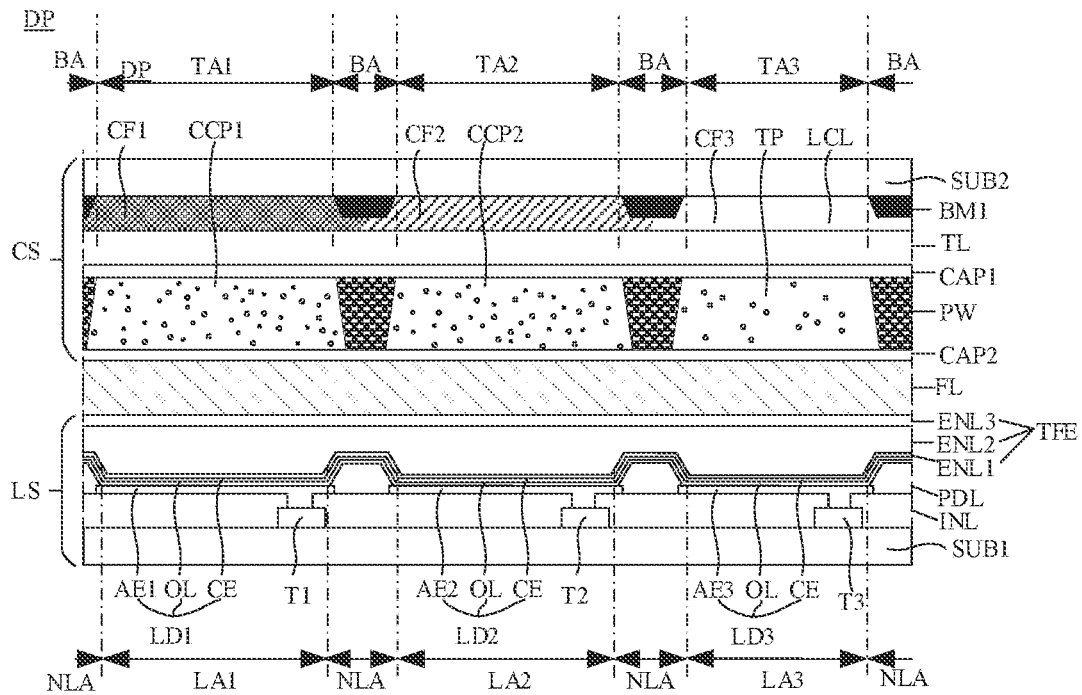
FIG. 22 is a section of yet another display panel, in accordance with some embodiments.

FIG. 22 is a diagram showing another structural variation of the display panel DP in the embodiments shown in FIG. 20. As shown in FIG. 22, the light adjustment layer LCL has a single-layer structure, and includes a mixture of the first particles P1 and the second particles P2. The first particles P1 and the second particles P2 are uniformly mixed in the matrix MR. A thickness of the light adjustment layer LCL is approximately equal to a thicknesses of the first color filters CF1 and a thicknesses of the second color filters CF2, so as to provide a flat surface for subsequent processes.

In some embodiments, the light adjustment layer LCL is directly disposed on the second base substrate SUB2. In other words, the light adjustment layer LCL is in direct contact with the second base substrate SUB2.

Figure 23:
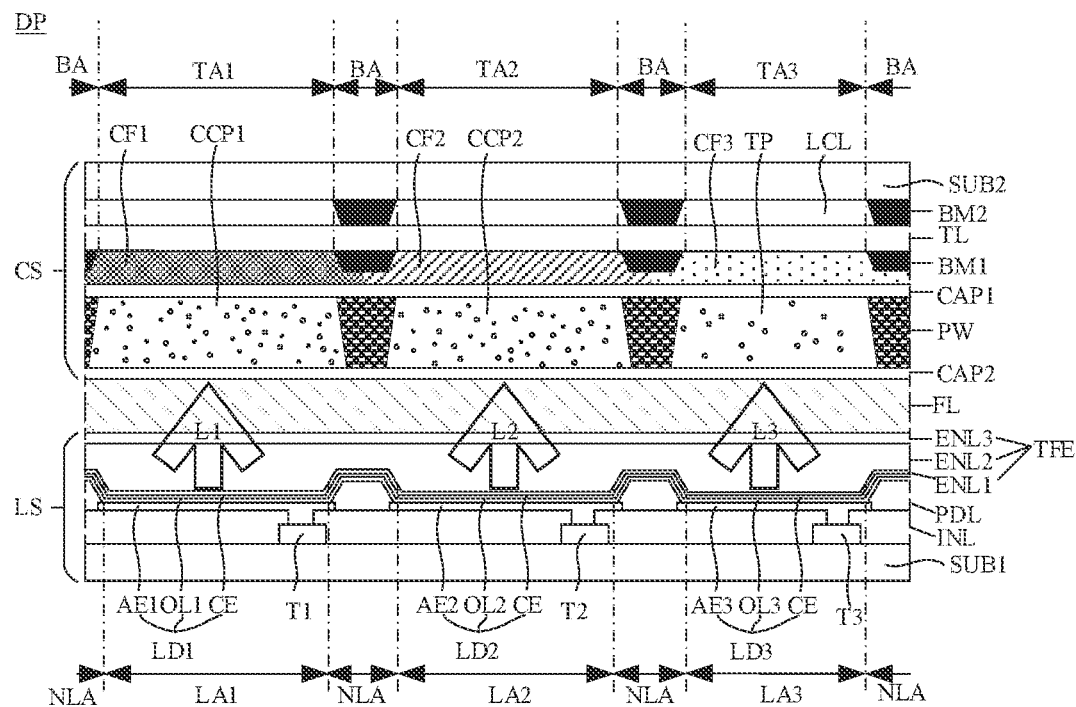
FIG. 23 is a section of yet another display panel, in accordance with some embodiments.

FIG. 23 is a diagram showing yet another structural variation of the display panel DP in the embodiments shown in FIG. 6. An emission spectrum of the first light-emitting devices LD1, an emission spectrum of the second light-emitting devices LD2 and an emission spectrum of the third light-emitting devices LD3 are different from each other. The first light-emitting devices LD1 emit first light L1, the second light-emitting devices LD2 emit second light L2, and the third light-emitting devices LD3 emit third light L3. In some embodiments, the first light L1, the second light L2 and the third light L3 may be same light, i.e., three kinds of light with approximately same peak wavelengths. For example, the first light L1, the second light L2 and the third light L3 are blue light of the same color. In some other embodiments, different light-emitting devices LD in the display panel DP emit light of different colors. The first light L1, the second light L2 and the third light L3 may be a different light. That is, a range of a peak wavelength of the first light L1, a range of a peak wavelength of the second light L2 and a range of a peak wavelength of the light L3 are different from each other. For example, the first light L1 is red light, the second light L2 is green light, and the third light L3 is blue light.

In addition, the first light L1, the second light L2 and the third light L3 may also be three kinds of light whose peak wavelengths are different from each other in a same peak wavelength range. In some examples, the first light L1 is blue light of a color, the second light L2 is blue light of another color, and the third light L3 is blue light of a color different from the colors of the above two blue light.

For the light-emitting device LD, factors that cause a difference between the light-emitting light L include but are not limited to different materials for forming the light-emitting layer OL, different mass fractions of light-emitting components in the light-emitting layer OL or other factors that may affect the emission spectrum of the first light-emitting material layer EML1, which is not limited here.

For example, a wavelength of an emission peak of the first light-emitting devices LD1 is in a range of 450 nm to 459 nm, inclusive. For example, the wavelength is 450 nm, 453 nm, 455.2 nm, 457.3 nm, 458.8 nm or 459 nm. A wavelength of an emission peak of the second light-emitting devices LD2 is in a range of 460 nm to 469 nm, inclusive. For example, the wavelength is 460 nm, 463 nm, 465.2 nm, 467.3 nm, 468.8 nm or 469 nm. A wavelength of an emission peak of the third light-emitting devices LD3 is in a range of 470 nm to 479 nm, inclusive. For example, the wavelength is 470 nm, 473 nm, 475.2 nm, 477.3 nm, 478.8 nm or 479 nm.

Of course, there may be a plurality of other cases. For example, the wavelength of the emission peak of the first light-emitting devices LD1 may be greater than the wavelength of the emission peak of the second light-emitting devices LD2. Alternatively, the wavelength of the emission peak of the first light-emitting devices LD1 may be greater than the wavelength of the emission peak of the third light-emitting devices LD3. The description above is only examples for illustration, which are not limited thereto.

With continued reference to FIG. 23, the first color conversion pattern CCP1 and the second color conversion pattern CCP2 have different light absorption characteristics due to different internal color conversion materials QD. This may be reflected in that, in cases where light of a different peak wavelength is converted into light of another specific color, or the peak of the light is shifted to a position of a peak of the light of another specific color, luminous efficiencies are different. In some examples, a luminous efficiency of the first color conversion pattern CCP1 when the first light L1 is converted into light of another specific peak wavelength, or the peak of the first light L1 is shifted to a position of a peak of the light of another specific peak wavelength is greater than a luminous efficiency of the first color conversion pattern CCP1 when the second light L2 is converted into light of another specific peak wavelength, or the peak of the second light L2 is shifted to a position of a peak of the light of another specific peak wavelength, and a luminous efficiency of the first color conversion pattern CCP1 when the third light L3 is converted into another specific peak wavelength, or the peak of the third light L3 is shifted to a position of a peak of the light of another specific peak wavelength. Similarly, a luminous efficiency of the second color conversion pattern CCP2 when the second light L2 is converted into light of another specific peak wavelength, or the peak of the second light L2 is shifted to a position of a peak of the light of another specific peak wavelength, is greater than a luminous efficiency of the second color conversion pattern CCP2 when the first light L1 is converted into light of another specific peak wavelength, or the peak of the first light L1 is shifted to a position of a peak of the light of another specific peak wavelength, and a luminous efficiency of the second color conversion pattern CCP2 when the third light L3 is converted into light of another specific peak wavelength, or the peak of the third light L3 is shifted to a position of a peak of the light of another specific peak wavelength.

Similarly, the color conversion pattern CCP and the light-transmitting pattern TP have different light transmission characteristics due to a presence or an absence of the internal color conversion material QD. This may be reflected in that, proportions of light with different peak wavelengths passing through the light-transmitting pattern TP are different. In some examples, a proportion of the third light L3 passing through the light-transmitting pattern TP is greater than a proportion of the second light L2 passing through the light-transmitting pattern TP and a proportion of the first light L1 passing through the light-transmitting pattern TP.

Therefore, it is realized that, an absorption spectrum of the first color conversion pattern CCP1 is matched with an emission spectrum of the first light-emitting device LD1, and an absorption spectrum of the second color conversion pattern CCP2 is matched with an emission spectrum of the second light-emitting device LD2, so that a light conversion ratio of the color conversion layer CCL is increased and color characteristics of the display panel are improved.

As shown in FIG. 23, the first light-transmitting region TA1, which corresponds to the first light-emitting region LA1, overlaps with or faces the first light-emitting region LA1; the second light-transmitting region TA2, which corresponds to the second light-emitting region LA2, overlaps with or faces the second light-emitting region LA2; and the third light-transmitting region TA3, which corresponds to the third light-emitting region LA3, overlaps with or faces the third light-emitting region LA3. By such an arrangement, the first color conversion pattern CCP1 may emit light by converting a peak wavelength of the first light L1 to another specific peak wavelength, or by shifting a peak of the wavelength of the first light L1 to a position of a peak of the another specific wavelength, the second color conversion pattern CCP2 may emit light by converting or shifting a peak wavelength of the second light L2 to another specific peak wavelength, or by shifting a peak of the wavelength of the second light L2 to a position of a peak of the another specific wavelength, and the light-transmitting pattern TP may transmit the third light L3. Therefore, a conversion efficiency of the light L by the first color conversion pattern CCP1 and a conversion efficiency of the second color conversion pattern CCP2 are improved, and a light transmission efficiency of the light-transmitting pattern TP is also improved, thereby improving the light extraction efficiency of the display panel DP.

Figure 24:
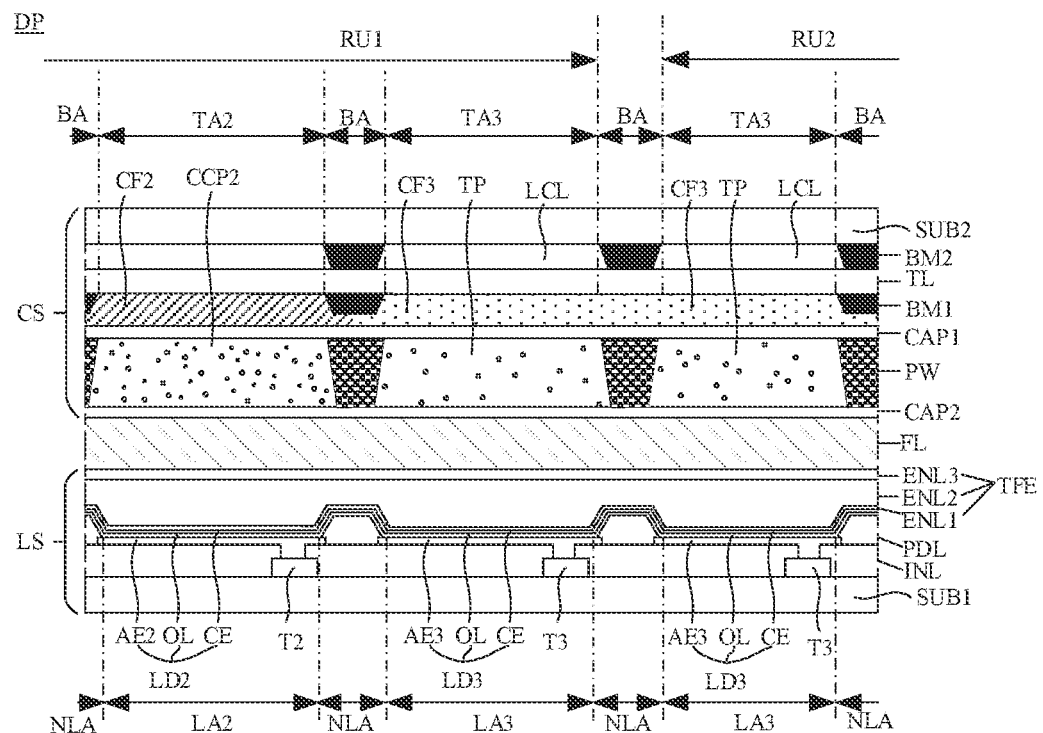
FIG. 24 is a section of yet another display panel, in accordance with some embodiments.

FIG. 24 is a diagram showing a structural variation of two adjacent repeating units in the display panel DP in the embodiments shown in FIG. 6. A first repeating unit RU1 and a second repeating unit RU2 are arranged adjacent to each other. Each repeating unit RU includes a first light-transmitting region TA1, a second light-transmitting region TA2 and a third light-transmitting region TA3. As shown in FIG. 24, a third light-transmitting region TA3 of the first repeating unit RU1 and a third light-transmitting region TA3 of the second repeating unit RU2 are arranged adjacent to each other. In some embodiments, a portion of the first light-shielding pattern BM1 between the two adjacent third light-transmitting regions TA3 is omitted; and in the first direction DR1, third color filters CF3 of a same color that are located in the third light-transmitting region TA3 of the first repeating unit RU1 and the third light-transmitting region TA3 of the second repeating unit RU2 may be of a continuous film layer.

Similarly, a second light-transmitting region TA2 of the first repeating unit RU1 and a second light-transmitting region TA2 of the second repeating unit RU2 may be arranged adjacent to each other. In some embodiments, a portion of the first light-shielding pattern BM1 is omitted between the two adjacent second light-transmitting regions TA2; and in the first direction DR1, second color filters CF2 of a same color that are located in the second light-transmitting region TA2 of the first repeating unit RU1 and the second light-transmitting region TA2 of the second repeating unit RU2 may be of a continuous film layer. Alternatively, a first light-transmitting region TA1 of the first repeating unit RU1 and a first light-transmitting region TA1 of the second repeating unit RU2 may be arranged adjacent to each other. In some embodiments, a portion of the first light-shielding pattern BM1 is omitted between the two adjacent first light-transmitting regions TA1; and in the first direction DR1, first color filters CF1 of a same color that are located in the first light-transmitting region TA1 of the first repeating unit RU1 and the first light-transmitting region TA1 of the second repeating unit RU2 may be of a continuous film layer. The two adjacent second light-transmitting regions TA2 or the adjacent two first light-transmitting regions TA1 have substantially same structure as the adjacent two third light-transmitting regions TA3 in FIG. 23.

Figure 25:
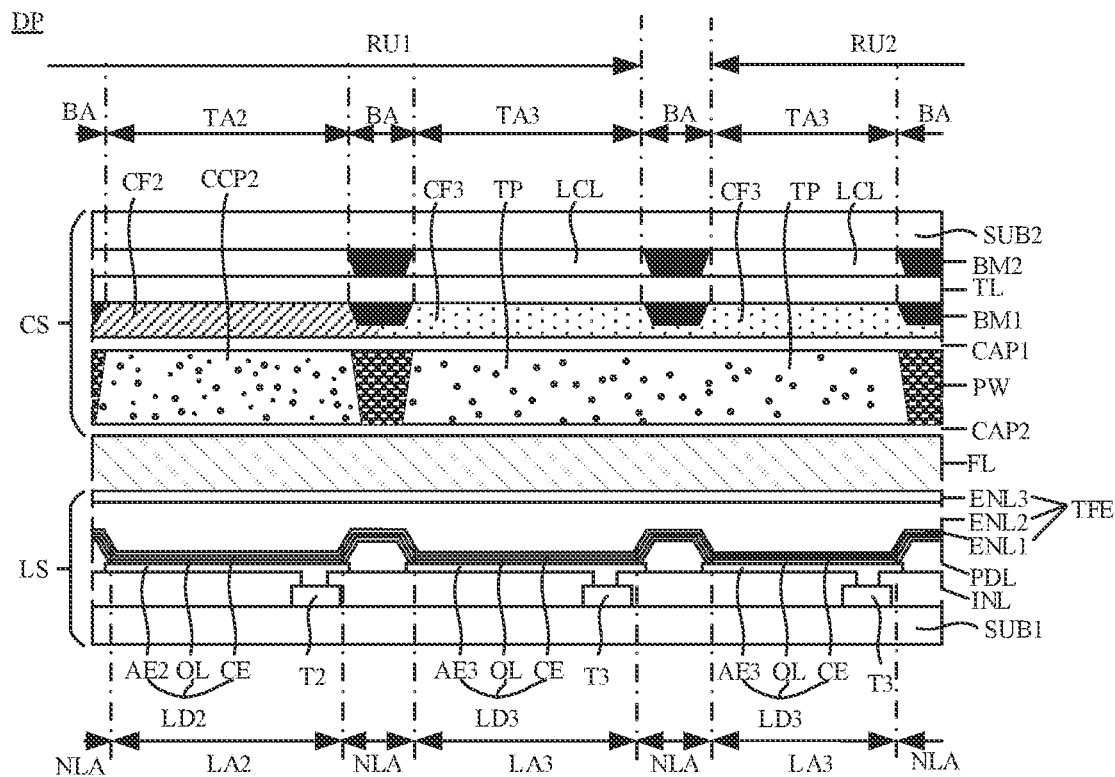
FIG. 25 is a section of yet another display panel, in accordance with some embodiments.

FIG. 25 is a diagram showing another structural variation of the two adjacent repeating units in the display panel DP in the embodiments shown in FIG. 6. A first repeating unit RU1 and a second repeating unit RU2 are arranged adjacent to each other. Each repeating unit RU includes a first light-transmitting region TA1, a second light-transmitting region TA2 and a third light-transmitting region TA3. As shown in FIG. 25, a third light-transmitting region TA3 of the first repeating unit RU1 and a third light-transmitting region TA3 of the second repeating unit RU2 are arranged adjacent to each other. In some embodiments, a portion of the partition wall PW between the two adjacent third light-transmitting regions TA3 is omitted; and in the first direction DR1, light-transmitting patterns TP of a same color that are located in the third light-transmitting region TA3 of the first repeating unit RU1 and the third light-transmitting region TA3 of the second repeating unit RU2 may be of a continuous film layer.

Figure 26:
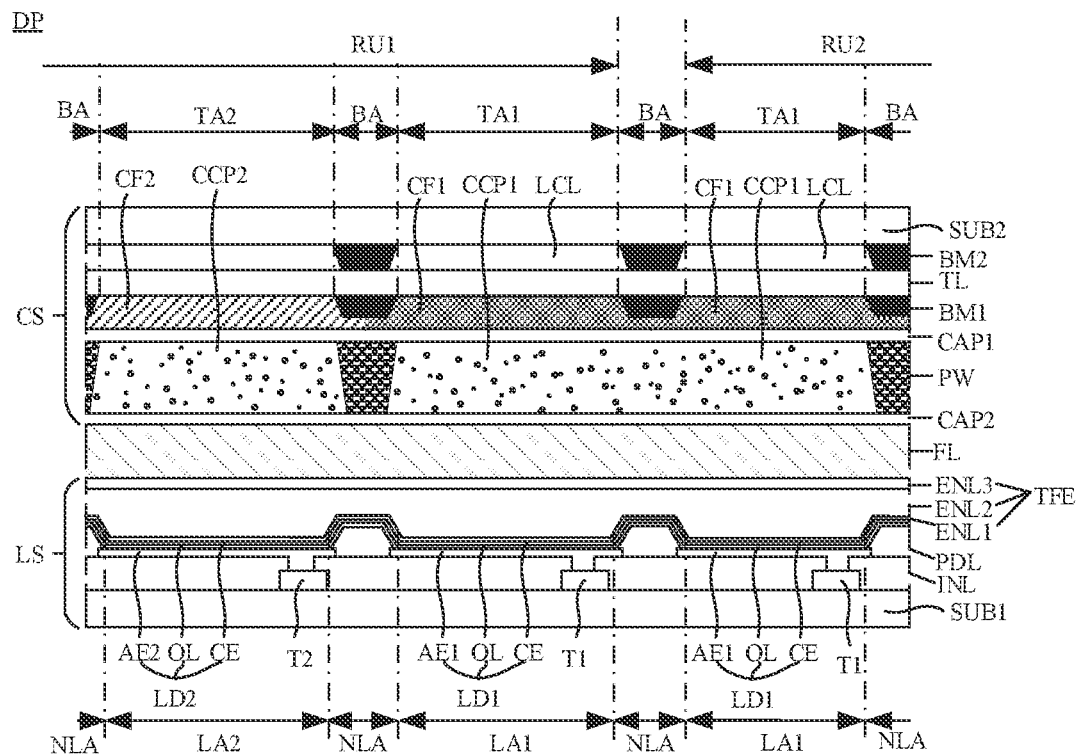
FIG. 26 is a section of yet another display panel, in accordance with some embodiments.

FIG. 26 is a diagram showing yet another structural variation of the two adjacent repeating units in the display panel DP in the embodiments shown in FIG. 6. A first repeating unit RU1 and a second repeating unit RU2 are arranged adjacent to each other. Each repeating unit RU includes a first light-transmitting region TA1, a second light-transmitting region TA2 and a third light-transmitting region TA3. As shown in FIG. 26, a first light-transmitting region TA1 of the first repeating unit RU1 and a first light-transmitting region TA1 of the second repeating unit RU2 are arranged adjacent to each other. In some embodiments, a portion of the partition wall PW between the two adjacent first light-transmitting regions TA1 is omitted; and in the first direction DR1, first color conversion patterns CCP1 of a same color that are located in the first light-transmitting region TA1 of the first repeating unit RU1 and the first light-transmitting region TA1 of the second repeating unit RU2 may be of a continuous film layer.

Similarly, a second light-transmitting region TA2 of the first repeating unit RU1 and a second light-transmitting region TA2 of the second repeating unit RU2 may be arranged adjacent to each other. In some embodiments, a portion of the partition wall PW between the two adjacent second light-transmitting regions TA2 is omitted; and in the first direction DR1, second color conversion patterns CCP2 of a same color that are located in the second light-transmitting region TA2 of the first repeating unit RU1 and the second light-transmitting region TA2 of the second repeating unit RU2 may be of a continuous film layer.

Figure 27:
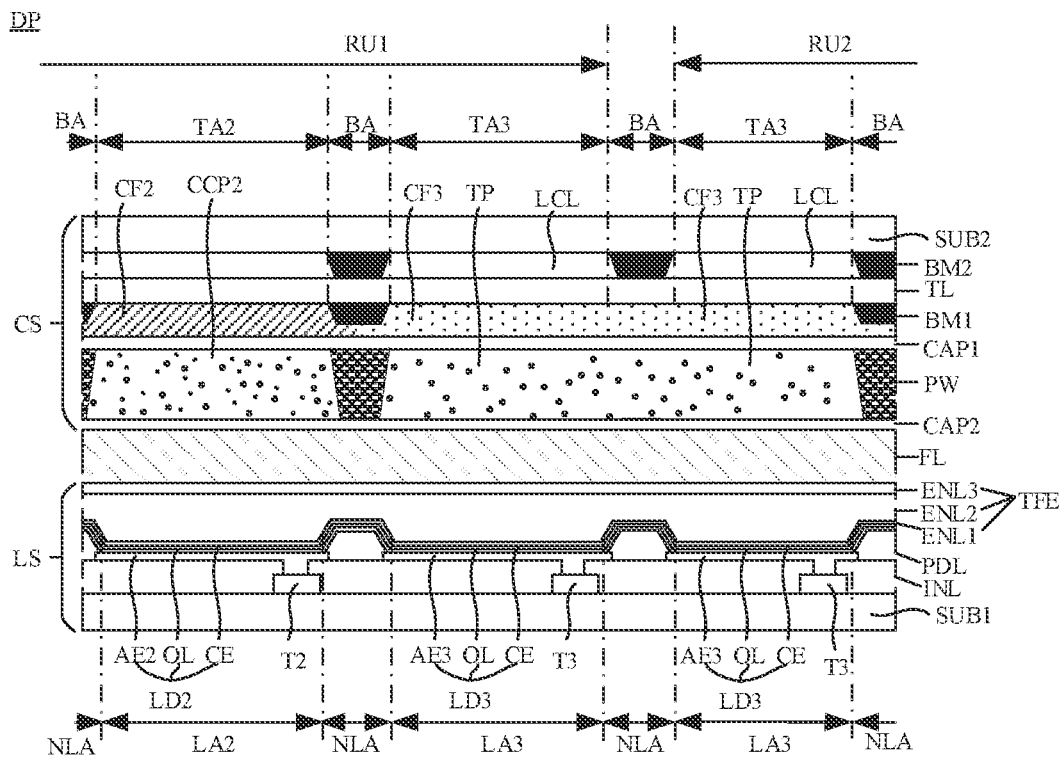
FIG. 27 is a section of yet another display panel, in accordance with some embodiments.

FIG. 27 is a diagram showing yet another structural variation of the two adjacent repeating units in the display panel DP in the embodiments shown in FIG. 6. A first repeating unit RU1 and a second repeating unit RU2 are arranged adjacent to each other. Each repeating unit RU includes a first light-transmitting region TA1, a second light-transmitting region TA2 and a third light-transmitting region TA3. As shown in FIG. 27, a third light-transmitting region TA3 of the first repeating unit RU1 and a third light-transmitting region TA3 of the second repeating unit RU2 are arranged adjacent to each other. In some embodiments, a portion of the first light-shielding pattern BM1 between the two adjacent third light-transmitting regions TA3 is omitted; and in the first direction DR1, third color filters CF3 of a same color that are located in the third light-transmitting region TA3 of the first repeating unit RU1 and the third light-transmitting region TA3 of the second repeating unit RU2 may be of a continuous film layer. In addition, a portion of the partition wall PW between the two adjacent third light-transmitting regions TA3 is omitted; and in the first direction DR1, light-transmitting patterns TP of a same color that are located in the third light-transmitting region TA3 in the first repeating unit RU1 and the third light-transmitting region TA3 in the second repeating unit RU2 may be of a continuous film layer.

Figure 28:
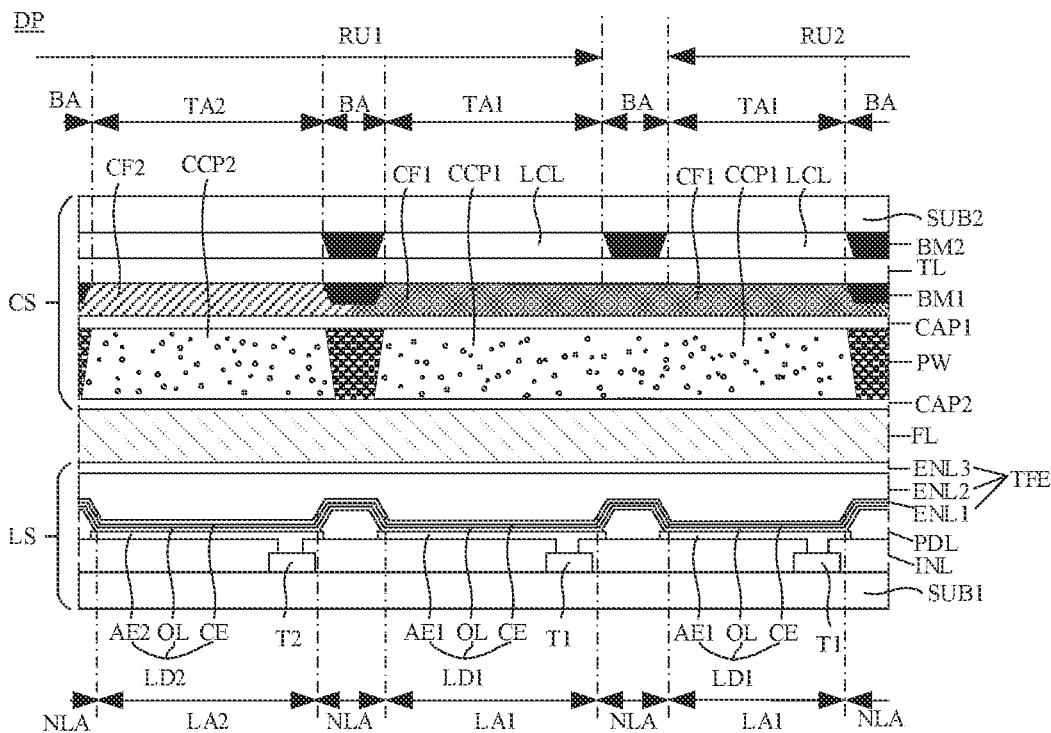
FIG. 28 is a section of yet another display panel, in accordance with some embodiments.

FIG. 28 is a diagram showing yet another structural variation of the two adjacent repeating units in the display panel DP in the embodiments shown in FIG. 6. A first repeating unit RU1 and a second repeating unit RU2 are arranged adjacent to each other. Each repeating unit RU includes a first light-transmitting region TA1, a second light-transmitting region TA2 and a third light-transmitting region TA3. As shown in FIG. 28, a first light-transmitting region TA1 of the first repeating unit RU1 and a first light-transmitting region TA1 of the second repeating unit RU2 are arranged adjacent to each other. In some embodiments, a portion of the first light-shielding pattern BM1 between the two adjacent first light-transmitting regions TA1 is omitted; and in the first direction DR1, first color filters CF1 of a same color that are located in the first light-transmitting region TA1 of the first repeating unit RU1 and the first light-transmitting region TA1 of the second repeating unit RU2 may be of a continuous film layer. In addition, a portion of the partition wall PW between the two adjacent first light-transmitting regions TA1 is omitted; and in the first direction DR1, the first color conversion patterns CCP1 of a same color that are located in the first light-transmitting region TA1 of the first repeating unit RU1 and the first light-transmitting region TA1 of the second repeating unit RU2 may be of a continuous film layer.

Similarly, a second light-transmitting region TA2 of the first repeating unit RU1 and a second light-transmitting region TA2 in the second repeating unit RU2 may be arranged adjacent to each other. In some embodiments, a portion of the first light-shielding pattern BM1 between the two adjacent second light-transmitting regions TA2 is omitted; and in the first direction DR1, second color filters CF2 of a same color that are located in the second light-transmitting region TA2 of the first repeating unit RU1 and the second light-transmitting region TA2 of the second repeating unit RU2 may be of a continuous film layer. In addition, a portion of the partition wall PW between the two adjacent second light-transmitting regions TA2 is omitted; and in the first direction DR1, second color conversion patterns CCP2 of a same color that are located in the second light-transmitting region TA2 of the first repeating unit RU1 and the second light-transmitting region TA2 of the second repeating unit RU2 may be of a continuous film layer.

Figure 30:
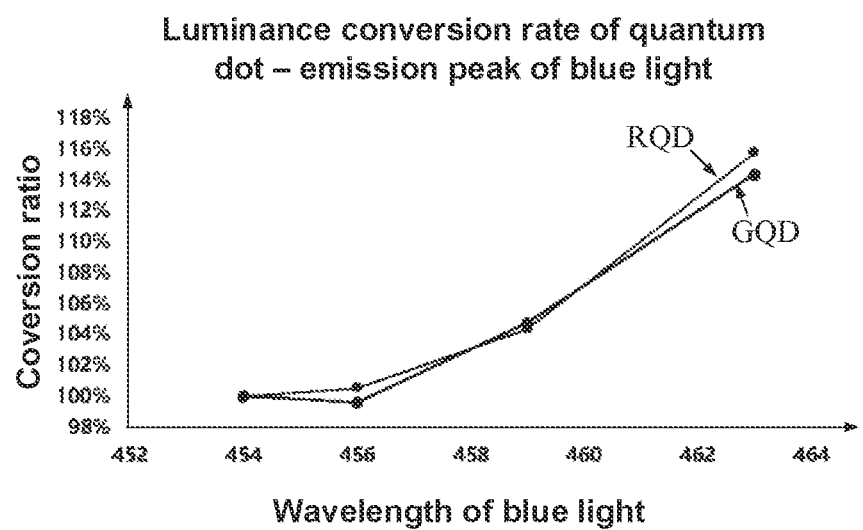
FIG. 30 is a comparison diagram of light conversion ratios of blue light by quantum dots at different wavelengths.

As shown in FIG. 30, the abscissa in FIG. 30 represents a wavelength of blue light, and the ordinate represents a luminance conversion rate of a quantum dot. It may be seen from FIG. 30 that, in a case where emission peaks of blue emission spectrums are different, luminance conversion rates of a red quantum dot RQD film and a green quantum dot GQD film are different. As a value of an emission peak (EL peak) of a blue OLED device increases, the luminance conversion rates of the red quantum dot RQD film and the green quantum dot GQD film increase. Thus, it may be seen that, the luminance conversion rates of the quantum dots are significantly affected by the emission peak of the blue emission spectrum of the blue OLED device. It may be seen from FIG. 30 that, when the wavelength of blue light increases from 454 nm to 463 nm, a luminance conversion rate of the red quantum dot RQD film is increased by 14.4%, and a luminance conversion rate of the green quantum dot GQD film is increased by 15.8%. Different quantum dot films actually have different optimal blue light excitation wavelengths.

It will be noted that, embodiments of the display panel DP provided in the present disclosure may be combined with each other to obtain the beneficial effects brought by all of the embodiments.

In addition, film layers in the display panel DP may be formed in sequence in a direction away from the first base substrate SUB1; or the light-emitting substrate LS and the color conversion substrate CS may be fabricated individually, and then assembled with each other in an opposing setting to form a cell shown in FIG. 6, which is not limited here.

Some embodiments of the present disclosure provide a color filter substrate. The color filter substrate includes the color conversion substrate CS as described above. A base substrate in the color filter substrate includes the second base substrate SUB2 as described above.

The color filter substrate has the structure of the color conversion substrate CS as described above, and thus has the beneficial effects of the color conversion substrate CS as described above, which will not be repeated here.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, having a plurality of repeating pixel units, each pixel unit including a first sub-pixel, a second sub-pixel and a third sub-pixel that are configured to display different colors, the display panel comprising:
   a first base substrate;
   a light-emitting device layer, located on a side of the first base substrate, wherein the light-emitting device layer includes first light-emitting devices, second light-emitting devices and third light-emitting devices, the first light-emitting devices are located in first sub-pixels respectively, the second light-emitting devices are located in second sub-pixels respectively, and the third light-emitting devices are located in third sub-pixels respectively;
   a color filter layer, located on a side of the light-emitting device layer away from the first base substrate, including at least a first light-shielding pattern, first color filters and second color filters, wherein the first light-shielding pattern defines a plurality of light-transmitting regions, the light-transmitting regions include first light-transmitting regions respectively corresponding to the first sub-pixels, second light-transmitting regions respectively corresponding to the second sub-pixels and third light-transmitting regions respectively corresponding to the third sub-pixels; the first color filters are located in the first light-transmitting regions respectively; and second color filters are located in the second light-transmitting regions respectively;
   a color conversion layer, located between the light-emitting device layer and the color filter layer, wherein the color conversion layer includes first color conversion patterns, second color conversion patterns and light-transmitting patterns, the first color conversion patterns are located in the first sub-pixels respectively, the second color conversion patterns are located in the second sub-pixels respectively, and the light-transmitting patterns are located in the third sub-pixels respectively;

a touch function layer, located on a side of the color conversion layer away from the first base substrate; and a light adjustment layer, located on a side of the touch function layer away from the first base substrate, wherein an orthographic projection of the light adjustment layer on the first base substrate at least overlaps with the third light-transmitting regions, the light adjustment layer includes first particles and second particles, the first particles each include dye molecules, and the second particles each have a hollow structure.

2. The display panel according to claim 1, wherein the orthographic projection of the light adjustment layer on the first base substrate only overlaps with the third light-transmitting regions.

3. The display panel according to claim 2, further comprising: transparent resin filling patterns disposed in a same layer as the light adjustment layer, wherein the first light-transmitting regions and the second light-transmitting regions each overlap with a respective transparent resin filling pattern.

4. The display panel according to claim 1, wherein the light adjustment layer includes a first light adjustment layer and a second light adjustment layer that are stacked, the first light adjustment layer includes the first particles, and the second light adjustment layer includes the second particles.

5. The display panel according to claim 4, wherein the first light adjustment layer is located on the side of the touch function layer away from the first base substrate, and the second light adjustment layer is located between the first light adjustment layer and the touch function layer; or the first light adjustment layer is located on the side of the touch function layer away from the first base substrate, and the second light adjustment layer is located on a side of the first light adjustment layer away from the touch function layer.

6. The display panel according to claim 4, wherein an orthographic projection of the first light adjustment layer on the first base substrate only overlaps with the third light-transmitting regions; or an orthographic projection of the second light adjustment layer on the first base substrate overlaps with the first light-transmitting regions, the second light-transmitting regions and the third light-transmitting regions.

7. The display panel according to claim 4, wherein the light adjustment layer further includes a second light-shielding pattern, the second light-shielding pattern is located in a light-blocking region that is non-overlapping with the first light-transmitting regions, the second light-transmitting regions and the third light-transmitting regions.

8. The display panel according to claim 7, wherein in a direction perpendicular to the display panel, a thickness of the second light-shielding pattern is less than or equal to a thickness of the first light adjustment layer; or the second light adjustment layer includes a plurality of first patterns a plurality of second patterns and a plurality of third patterns that are separated from each other: the first patterns are located in the first light-transmitting regions respectively the second patterns are located in the second light-transmitting regions respectively, and the third patterns are located in the third light-transmitting regions respectively; and in a direction perpendicular to the display panel, a thickness of the second light-shielding pattern is approximately equal to a thickness of a first pattern of the plurality of first patterns and/or a thickness of a second pattern of the plurality of second patterns, and is approximately equal to a sum of a thickness of a third pattern of the plurality of third patterns and a thickness of the first light adjustment layer.

9. The display panel according to claim 4, wherein the light adjustment layer and the color filter layer are disposed in a same layer.

10. The display panel according to claim 1, wherein a color of the dye molecules is same as a color of the third sub-pixel; or the second particles each are in a shape of a sphere, and include a core portion filled with air and a shell portion surrounding the core portion.

11. The display panel according to claim 1, wherein the first color conversion patterns and the second color conversion patterns both include a quantum dot material and scattering particles.

12. The display panel according to claim 1, further comprising:

a light extraction layer, located on a side of the light-emitting device layer away from the first base substrate, and an encapsulation layer, located on a side of the light extraction layer away from the first base substrate; or the display panel further comprising:

a second base substrate located on a side of the light adjustment layer away from the first base substrate.

13. A color filter substrate, comprising:

a base substrate;

a color filter layer, located on the base substrate, at least including a first light-shielding pattern, first color filters and second color filters, wherein the first light-shielding pattern defines a plurality of light-transmitting regions, the light-transmitting regions include first light-transmitting regions for transmitting light of a first color, second light-transmitting regions for transmitting light of a second color and third light-transmitting regions for transmitting light of a third color;

a color conversion layer, located on a side of the color filter layer away from the base substrate, including first color conversion patterns, second color conversion patterns and light-transmitting patterns;

a touch function layer, located between the color conversion layer and the base substrate; and a light adjustment layer, located between the touch function layer and the base substrate, wherein an orthographic projection of the light adjustment layer on the base substrate at least overlaps with the third light-transmitting regions, the light adjustment layer includes first particles and second particles, the first particles each includes dye molecules, and the second particles each have a hollow structure.

14. The color film substrate according to claim 13, wherein the orthographic projection of the light adjustment layer on the base substrate only overlaps with the third light-transmitting regions.

15. The color filter substrate according to claim 14, further comprising: transparent resin filling patterns disposed in a same layer as the light adjustment layer, wherein the first light-transmitting regions and the second light-transmitting regions each overlap with a respective transparent resin filling pattern.

16. The color filter substrate according to claim 13, wherein the light adjustment layer includes a first light adjustment layer and a second light adjustment layer that are stacked, the first light adjustment layer includes the first particles, and the second light adjustment layer includes the second particles.

17. The color filter substrate according to claim 16, wherein the second light adjustment layer is located between the first light adjustment layer and the touch function layer; or
the first light adjustment layer is located between the second light adjustment layer and the touch function laver.

18. The color filter substrate according to any one according to claim 16, wherein an orthographic projection of the first light adjustment layer on the base substrate only overlaps with the third light-transmitting regions; or
an orthographic projection of the second light adjustment layer on the base substrate overlaps with the first light-transmitting regions the second light-transmitting regions and the third light-transmitting regions.

19. The color filter substrate according to claim 16, wherein the light adjustment layer further includes a second light-shielding pattern, the second light-shielding pattern is located in a light-blocking region that is non-overlapping with the first light-transmitting regions, the second light-transmitting regions and the third light-transmitting regions.

20. The color filter substrate according to claim 19, wherein the second light adjustment layer includes a plurality of first patterns, a plurality o second patterns and a plurality of third patterns that are separated from each other;
the first patterns are located in the first light-transmitting regions, the second patterns are located in the second light-transmitting regions, and the third patterns are located in the third light-transmitting regions; and
in a direction perpendicular to the color filter substrate, a thickness of the second light-shielding pattern is approximately equal to a thickness of a first pattern of the plurality of first patterns and/or a thickness of a second pattern of the plurality of second patterns, and is approximately equal to a sum of a thickness of a third pattern of the plurality of third patterns and a thickness of the first light adjustment layer.

\* \* \* \* \*